US012718885B2

(12) United States Patent
Zhu et al.

(10) Patent No.: US 12,718,885 B2
(45) Date of Patent: Aug. 25, 2026

(54) METHOD FOR OPERATING MEMORY, MEMORY AND MEMORY SYSTEM

(71) Applicant: Yangtze Memory Technologies Co., Ltd., Wuhan (CN)

(72) Inventors: Ting Zhu, Wuhan (CN); Tingting Wang, Wuhan (CN); Bin Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 142 days.

(21) Appl. No.: 18/885,833

(22) Filed: Sep. 16, 2024

(65) Prior Publication Data

US 2026/0011376 A1 Jan. 8, 2026

(30) Foreign Application Priority Data

Jul. 2, 2024 (CN) ........................ 202410881763.5

(51) Int. Cl.

| | |
|---|---|
| ***G11C 16/14*** | (2006.01) |
| ***G06F 3/06*** | (2006.01) |
| ***G11C 16/04*** | (2006.01) |
| ***G11C 16/08*** | (2006.01) |

(52) U.S. Cl.

CPC ............ *G11C 16/14* (2013.01); *G06F 3/0602* (2013.01); *G06F 3/0652* (2013.01); *G06F 3/0679* (2013.01); *G11C 16/0483* (2013.01); *G11C 16/08* (2013.01)

(58) Field of Classification Search

CPC ..................................................... G11C 16/14

See application file for complete search history.

(56) References Cited

U.S. PATENT DOCUMENTS 10,643,711 B1 * 5/2020 Yuan ...................... G11C 16/32

* cited by examiner

*Primary Examiner* — Hoai V Ho

(74) *Attorney, Agent, or Firm* — BAYES PLLC

(57) ABSTRACT

According to one aspect of the present disclosure, a method for operating a memory is provided. The method may include receiving an erase resume command. The erase resume command may indicate a resume of an erase operation on a memory block in a memory. The method may include, if the erase operation is in an erase pulse phase, releasing, at a first time, a voltage of a special word line to which the memory block is connected in response to a quantity of erase suspends of the memory block being less than a threshold. The quantity of erase suspends may refer to a quantity that the erase operation is suspended in the erase pulse phase. The method may include releasing, at a second time, the voltage of the special word line in response to the quantity of erase suspends being greater than or equal to the threshold, wherein the second time is earlier than the first time.

20 Claims, 10 Drawing Sheets

METHOD FOR OPERATING MEMORY, MEMORY AND MEMORY SYSTEM

CROSS-REFERENCE TO RELATED APPLICATIONS

This application claims the benefit of priority to Chinese Application No. 202410881763.5, filed on Jul. 2, 2024, which is incorporated herein by reference in its entirety.

TECHNICAL FIELD

The present disclosure relates to the technical field of memory technologies, and in particular, to a method for operating memory, a memory, and a memory system.

BACKGROUND

Memory supports a variety of operations, such as program operations, erase operations, and read operations, where the program operation process or erase operation process also supports suspend command and resume command. Taking the erase operation process as an example, the suspend command and the resume instruction supported by the erase operation process are referred to as an erase suspend command and an erase resume command, respectively, during the erase operation process, if an erase suspend instruction is received, the memory suspends the currently executed erase operation, and subsequently, when the erase resume command is received, the memory continues to execute the suspended erase operation.

SUMMARY

According to one aspect of the present disclosure, a method for operating a memory is provided. The method may include receiving an erase resume command. The erase resume command may indicate a resume of an erase operation on a memory block in a memory. The method may include, if the erase operation is in an erase pulse phase, releasing, at a first time, a voltage of a special word line to which the memory block is connected in response to a quantity of erase suspends of the memory block being less than a threshold. The quantity of erase suspends may refer to a quantity that the erase operation is suspended in the erase pulse phase. The method may include releasing, at a second time, the voltage of the special word line in response to the quantity of erase suspends being greater than or equal to the threshold. In some implementations, the second time may be earlier than the first time.

In some implementations, the threshold may be greater than or equal to 20 and less than or equal to 60.

In some implementations, the special word line may be configured to connect a select gate or a virtual memory cell in the memory block.

In some implementations, when the voltage of the special word line is released at the first time, the voltage of the special word line may be maintained at a first voltage for a first time period after the first time. In some implementations, when the voltage of the special word line is released at the second time, the voltage of the special word line may be maintained at a second voltage for the first time period. In some implementations, the second voltage may be greater than the first voltage.

In some implementations, after receiving the erase resume command, the method may include, if the erase operation is in the erase pulse phase, applying an erase voltage to at least one of an array common source or bit line to which the memory block is connected. In some implementations, after receiving the erase resume command, the releasing, at the first time, the voltage of the special word line to which the memory block is connected in response to the quantity of erase suspends of the memory block being less than the threshold may include, in response to the quantity of erase suspends being less than the threshold, releasing the voltage of the special word line when the voltage of the at least one of the array common source or bit line rises to a third voltage. In some implementations, the third voltage may be less than the erase voltage. In some implementations, after receiving the erase resume command, the releasing, at the second time, the voltage of the special word line in response to the quantity of erase suspends being greater than or equal to the threshold may include, in response to the quantity of erase suspends being greater than or equal to the threshold, releasing the voltage of the special word line when the voltage of the at least one of the array common source or bit line rises to a fourth voltage. In some implementations, the fourth voltage may be less than the third voltage.

In some implementations, before receiving the erase resume command, the method may include executing an erase operation on the memory block, and setting the quantity of erase suspends to 0. In some implementations, before receiving the erase resume command, the method may include, in response to the erase suspend command in the erase pulse phase, suspending the erase operation, and increasing the quantity of erase suspends of the memory block, to obtain an increased quantity of erase suspends. In some implementations, the erase suspend command may indicate suspending the erase operation.

In some implementations, when the quantity of erase suspends is less than the threshold, the erase count flag of the memory block is a first flag. In some implementations, the first flag may indicate that the quantity of erase suspends of the memory block does not reach the threshold. In some implementations, when the quantity of erase suspends is greater than or equal to the threshold, the erase count flag of the memory block is a second flag. In some implementations, the second flag may indicate that the quantity of erase suspends of the memory block reaches the threshold.

In some implementations, the releasing, at the first time, the voltage of the special word line to which the memory block is connected in response to the quantity of erase suspends of the memory block being less than the threshold may include releasing, at the first time, the voltage of the special word line to which the memory block is connected in response to the erase count flag of the memory block being the first flag. In some implementations, the releasing, at the second time, the voltage of the special word line in response to the quantity of erase suspends being greater than or equal to the threshold may include releasing, at the second time, the voltage of the special word line in response to the erase count flag of the memory block being the second flag.

According to another aspect of the present disclosure, a memory is provided. The memory may include a peripheral circuit and a memory block. The memory block may include a special cell and a plurality of memory cells. The peripheral circuit may be coupled to the special cell through a special word line. The peripheral circuit may be coupled to the plurality of memory cells through a plurality of non-special word lines. The peripheral circuit may be configured to receive an erase resume command. The erase resume command may indicate a resume of an erase operation on the memory block. The peripheral circuit may be configured to, if the erase operation is in an erase pulse phase, release, at a first time, a voltage of the special word line to which the memory block is connected in response to a quantity of erase suspends of the memory block being less than a threshold. The quantity of erase suspends may refer to a quantity that the erase operation is suspended in the erase pulse phase. The peripheral circuit may be configured to release, at a second time, the voltage of the special word line in response to the quantity of erase suspends being greater than or equal to the threshold. The second time may be earlier than the first time.

In some implementations, the threshold may be greater than or equal to 20 and less than or equal to 60.

In some implementations, the special cell may include a select gate or a virtual memory cell.

In some implementations, when the voltage of the special word line is released at the first time, the voltage of the special word line may be maintained at a first voltage for a first time period after the first time. In some implementations, when the voltage of the special word line is released at the second time, the voltage of the special word line is maintained at a second voltage for the first time period. In some implementations, the second voltage may be greater than the first voltage.

In some implementations, the peripheral circuit may be further configured to, if the erase operation is in the erase pulse phase, apply an erase voltage to at least one of an array common source or bit line to which the memory block is connected. In some implementations, the peripheral circuit may be further configured to, in response to the quantity of erase suspends being less than the threshold, release the voltage of the special word line when the voltage of the at least one of the array common source or bit line rises to a third voltage. In some implementations, the third voltage may be less than the erase voltage. In some implementations, the peripheral circuit may be further configured to, in response to the quantity of erase suspends being greater than or equal to the threshold, release the voltage of the special word line when the voltage of the at least one of the array common source or bit line rises to a fourth voltage. In some implementations, the fourth voltage may be less than the third voltage.

In some implementations, the peripheral circuit may be configured to execute an erase operation on the memory block, and set the quantity of erase suspends to 0. In some implementations, the peripheral circuit may be configured to, in response to the erase suspend command in the erase pulse phase, suspend the erase operation, and increase the quantity of erase suspends of the memory block, to obtain an increased quantity of erase suspends. In some implementations, the erase suspend command may indicate suspending the erase operation.

In some implementations, when the quantity of erase suspends is less than the threshold, the erase count flag of the memory block is a first flag, and the first flag indicates that the quantity of erase suspends of the memory block does not reach the threshold. In some implementations, when the quantity of erase suspends is greater than or equal to the threshold, the erase count flag of the memory block is a second flag, and the second flag indicates that the quantity of erase suspends of the memory block reaches the threshold.

In some implementations, the peripheral circuit may be configured to release, at the first time, the voltage of the special word line to which the memory block is connected in response to the erase count flag corresponding to the memory block being the first flag. In some implementations, the peripheral circuit may be configured to release, at the second time, the voltage of the special word line in response to the erase count flag corresponding to the memory block being the second flag.

In some implementations, the peripheral circuit may include a register configured to store at least one of the quantity of erase suspends, the threshold, and the erase count flag.

According to a further aspect of the present disclosure, a memory system is provided. The memory system may include a memory. The memory may include a memory block and a peripheral circuit. The memory system may include a memory controller coupled to the memory. The memory controller may be configured to control the memory. The memory block may include a special cell and a plurality of memory cells. The peripheral circuit may be coupled to the special cell through a special word line. The peripheral circuit may be coupled to the plurality of memory cells through a plurality of non-specific word lines. The peripheral circuit may be configured to receive an erase resume command. The erase resume command may indicate a resume of an erase operation on the memory block. The peripheral circuit may be configured to, if the erase operation is in an erase pulse phase, release, at a first time, a voltage of the special word line to which the memory block is connected in response to a quantity of erase suspends of the memory block being less than a threshold. The quantity of erase suspends may refer to a quantity that the erase operation is suspended in the erase pulse phase. The peripheral circuit may be configured to release, at a second time, the voltage of the special word line in response to the quantity of erase suspends being greater than or equal to the threshold. In some implementations, the second time may be earlier than the first time.

In some implementations, the threshold may be greater than or equal to 20 and less than or equal to 60.

In some implementations, the special cell may include a select gate or a virtual memory cell.

In some implementations, when the voltage of the special word line is released at the first time, the voltage of the special word line may be maintained at a first voltage for a first time period after the first time. In some implementations, when the voltage of the special word line is released at the second time, the voltage of the special word line may be maintained at a second voltage for the first time period. In some implementations, the second voltage may be greater than the first voltage.

In some implementations, the peripheral circuit may be configured to, if the erase operation is in the erase pulse phase, apply an erase voltage to at least one of an array common source or bit line to which the memory block is connected. In some implementations, the peripheral circuit may be configured to, in response to the quantity of erase suspends being less than the threshold, release the voltage of the special word line when the voltage of the at least one of the array common source or bit line rises to a third voltage. In some implementations, the third voltage may be less than the erase voltage. In some implementations, the peripheral circuit may be configured to, in response to the quantity of erase suspends being greater than or equal to the threshold, release the voltage of the special word line when the voltage of the at least one of the array common source or bit line rises to a fourth voltage. In some implementations, the fourth voltage may be less than the third voltage.

In some implementations, the peripheral circuit may be further configured to execute an erase operation on the memory block, and set the quantity of erase suspends to 0. In some implementations, the peripheral circuit may be further configured to, in response to the erase suspend command in the erase pulse phase, suspend the erase operation, and increase the quantity of erase suspends of the memory block, to obtain an increased quantity of erase suspends. In some implementations, the erase suspend command may indicate suspending the erase operation.

In some implementations, when the quantity of erase suspends is less than the threshold, the erase count flag of the memory block may be a first flag. In some implementations, the first flag may indicate that the quantity of erase suspends of the memory block does not reach the threshold. In some implementations, the peripheral circuit may be further configured to, when the quantity of erase suspends is greater than or equal to the threshold, the erase count flag of the memory block may be a second flag. In some implementations, the second flag may indicate that the quantity of erase suspends of the memory block reaches the threshold.

In some implementations, the peripheral circuit may be further configured to release, at the first time, the voltage of the special word line to which the memory block is connected in response to the erase count flag corresponding to the memory block being the first flag. In some implementations, the peripheral circuit may be further configured to release, at the second time, the voltage of the special word line in response to the erase count flag corresponding to the memory block being the second flag.

In some implementations the peripheral circuit may include a register configured to store at least one of the quantity of erase suspends, the threshold, and the erase count flag.

DETAILED DESCRIPTION

To make the objectives, technical solutions and advantages of this application clearer, the implementations of this application are described in detail below with reference to the drawings.

In this application, the terms “first”, “second” and the like are used to distinguish the same items or similar items that are substantially the same in function, and it should be understood that “first”, “second”, and “nth” do not have a dependency relationship in logic or timing, nor define a quantity and an execution order. It should also be understood that while the following disclosure uses the terms first, second, etc. to describe various elements, these elements should not be limited by the terms.

These terms are only used to distinguish one element from another element. For example, a first element can be referred to as a second element, and similarly, a second element can also be referred to as a first element, without departing from the scope of the various examples. Both the first element and the second element may be elements, and in some cases may be separate and distinct elements.

At least one refers to one or more, for example, the at least one element may be one element, two elements, three elements, or any integer (greater than or equal to one) number of elements. At least two refer to two or more, for example, the at least two elements may be two elements, three elements, or any integer (greater than or equal to two) number of elements.

During an erase operation process, if the memory receives the erase suspend command multiple times, the erase operation will be suspended for multiple times, resulting in a decrease in the stability and performance of the memory. The present disclosure provides various solutions to these and other challenges.

Figure 1:
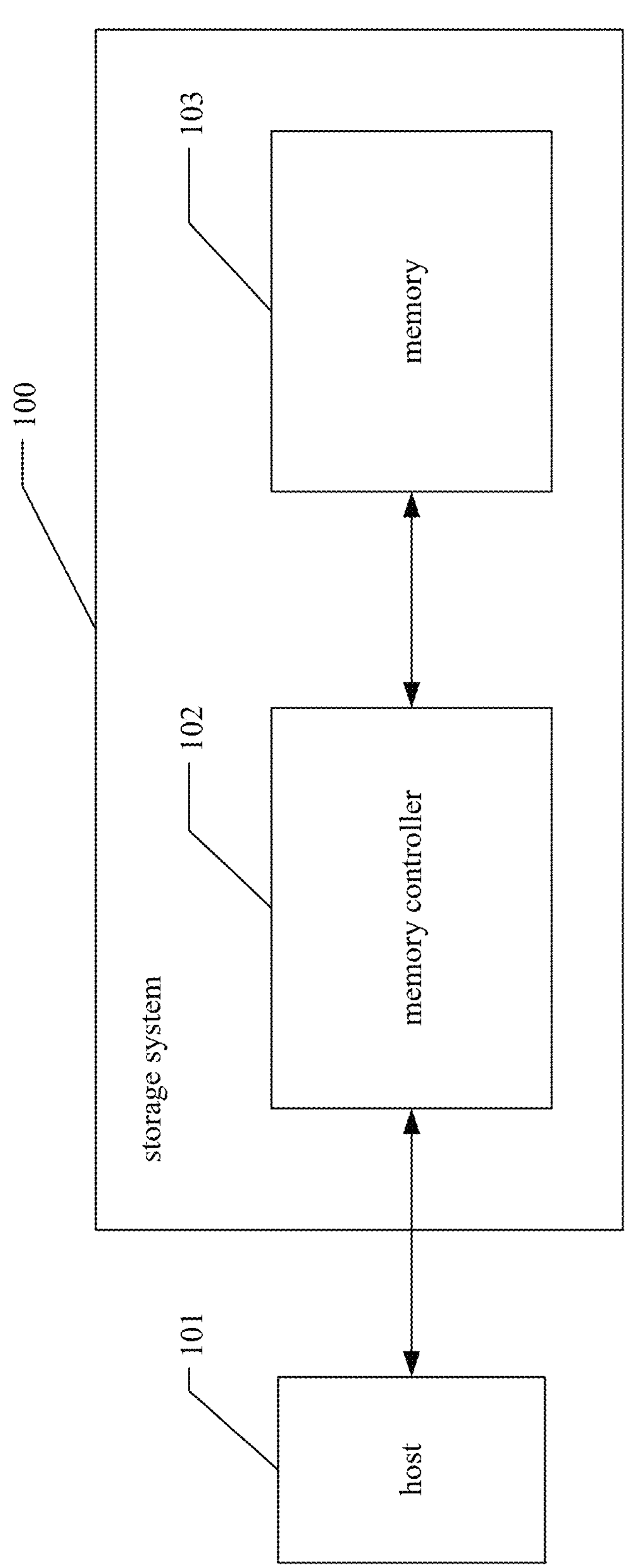
FIG. 1 is a schematic diagram of an application environment of a memory system, according to an implementation of the present disclosure.

FIG. 1 is a schematic diagram of an application environment of a memory system according to an implementation of the present disclosure, where the application environment includes a memory system 100 and a host 101, and the host 101 may be a mobile phone, a desktop computer, a laptop computer, a tablet computer, a vehicle computer, a game console, a printer, a positioning device, a wearable electronic device, a smart sensor, a virtual reality (VR) device, an augmented reality (AR) device, or any other suitable electronic device including a storage therein. Depending on the interface protocol for connecting the memory system 100 and the host 101, the memory system 100 may be configured as a universal flash storage (UFS) device, a solid state disk (SSD), a multimedia card (MMC), a secure digital (SD) card, a computer memory card international association (PCMCIA) card type storage device, a peripheral component interconnect (PCI) type storage device, a high-speed PCI (PCI-E) type storage device, a compact flash memory (CF) card, a smart media card or memory stick, etc., where examples of a multimedia card (MMC) include an embedded multimedia card (eMMC), a small size multimedia card (RS-MMC), and a micro MMC, etc., examples of a SD card include a mini-SD and a micro-SD.

The host 101 may control an operation of the memory system 100, for example, the host 101 may control an operation of the memory system 100 through an instruction, for example, the host 101 sends an instruction to the memory control system 102, and the memory controller 102 executes a corresponding operation (such as operations of data programming, data reading, data erasing, or other operations) in response to an instruction of the host 101. Alternatively, the host 101 may include a host processor and a host memory, where the host processor may control operation of the host 101. For example, the host processor may interact with the memory system 100 through a memory driver to control the operation of the memory system 100. The memory driver may be a software module for controlling the memory system 100, and the memory driver may further load the mapping table in the host memory, to improve a speed at which the host processor controls the memory system 100 to execute a read operation.

The memory system 100 may store data accessed by the host 101, which may be configured to send data to the memory system 100. Alternatively, the host 101 may be configured to receive data from the memory system 103.

As shown in FIG. 1, the memory system 100 includes a memory controller 102 and a memory 103, where there is at least one memory 103, the memory 103 (such as a NAND flash memory device, a three-dimensional (3D) NAND flash memory device, or the like) is a storage medium for storing data in the memory system 100.

The memory controller 102 may control the memory 103. In FIG. 1, the memory controller 102 is deployed outside the host 101, the memory controller 102 is coupled to the host 101, and communicates with the host 101, and the memory controller 102 and the memory 103 are integrated into the memory system 100. In some other implementations, the memory controller 102 is not integrated in the memory system 100, the memory controller 102 is integrated in the host 101, and the memory controller 102 in the host 101 communicates with the memory 103 outside the host 101 to control the memory 103. In some other implementations, a portion of functional modules of the memory controller 102 are integrated in the host 101, another portion of the functional modules are integrated in the memory system 100, and these two portions of functional modules cooperate with each other to control the memory 103. For example, functions such as a front end (FE) and a flash translation layer (FTL) of the memory controller 102 are integrated in the host 101, and a back end (BE) function of the memory controller 102 is integrated in the memory system 100, or an FE function of the memory controller 102 is integrated in the host 101, and functions such as an FTL and a BE of the memory controller 102 are integrated in the memory system 100.

The memory controller 102 is also coupled to the memory 103, manages data stored in the memory 103, and is responsible for data scheduling between the memory 103 and the host 101. The memory controller 102 may be configured to control operations of the memory 103, such as read operations, erase operations, and program operations. The memory controller 102 may also be configured to manage various functions regarding data stored in or to be stored in the memory 103, including, but not limited to, bad block management, garbage collection, logical address to physical address translation, wear leveling, and the like. Memory controller 102 may also execute any other suitable function, such as formatting memory 103.

Figure 2:
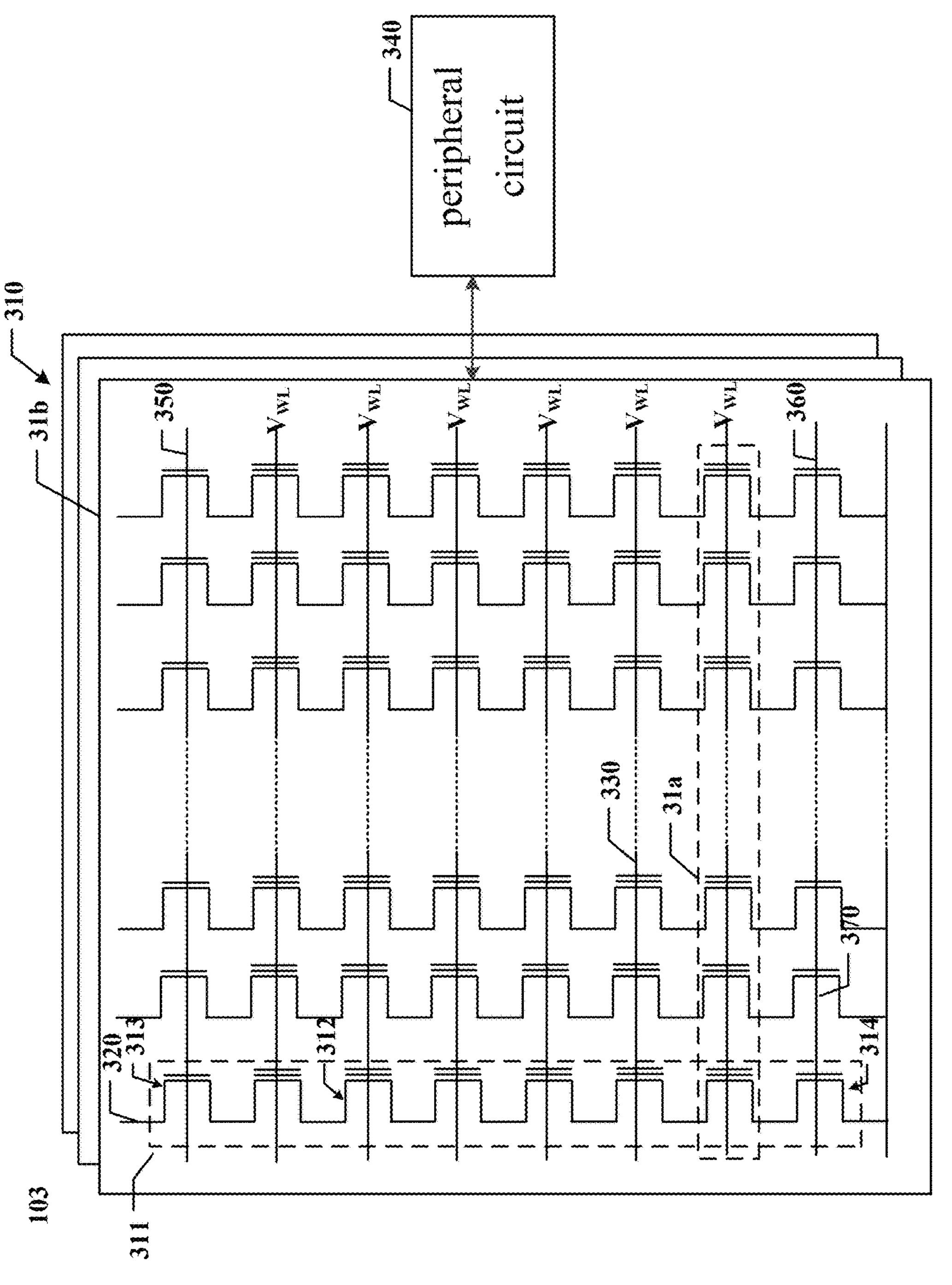
FIG. 2 is a schematic diagram of a memory, according to an implementation of the present disclosure.
Figure 4:
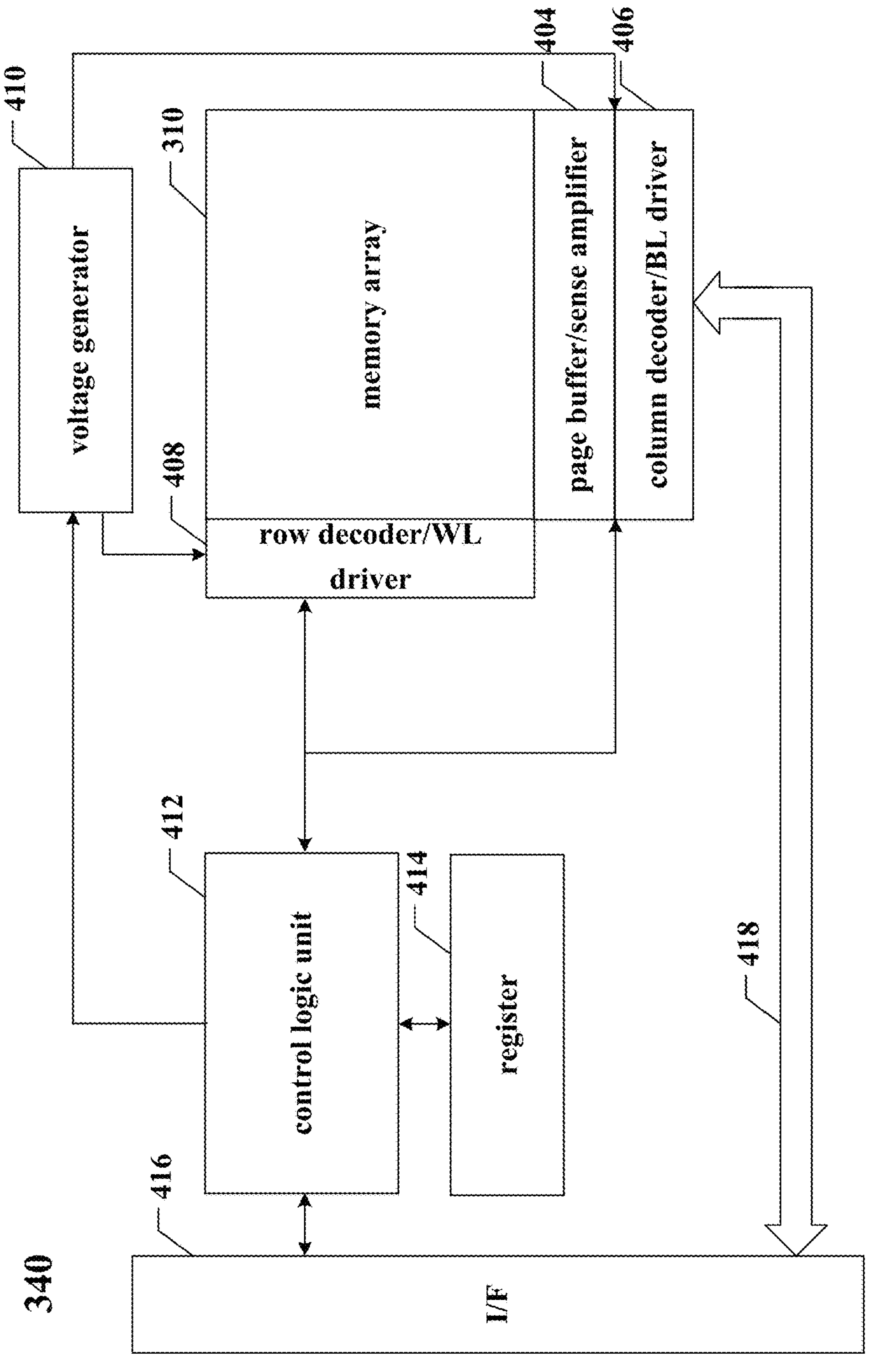
FIG. 4 is a schematic structural diagram of a peripheral circuit, according to an implementation of the present disclosure.

FIG. 2 is a schematic diagram of a memory according to an implementation of the present disclosure. As shown in FIG. 4, the memory 103 includes a memory array 310, a plurality of bit lines (BLs) 320, a plurality of word lines (WLs) 330, and a peripheral circuit 340.

The memory array 310 includes a plurality of memory strings 311 arranged in an array above a substrate (not shown), each memory string 311 extending vertically above the substrate.

Each memory string 311 includes a plurality of memory cells 312, and the plurality of memory cells 312 in each memory string 311 are vertically stacked above substrate of the memory array 310. Each memory cell 312 has a function of storing data, the stored data is determined by the number of electrons stored in the memory cell 312, and the number of electrons stored in the memory cell 312 can determine the magnitude of the threshold voltage of the memory cell 312, so the threshold voltage of the memory cell 312 can indicate the data stored therein. The memory cell 312 is a floating gate field effect transistor or a charge trap type field effect transistor. In some implementations, the memory cell 312 may include two possible storage states, for example, the memory cell 312 may include a single level cell (SLC) which stores one bit of data. For example, the first storage state "0" of the SLC may correspond to the threshold voltage being in a first voltage range, and the threshold voltage corresponding to the first storage state "1" of the SLC is in a second voltage range. In other implementations, the memory cell 312 may store at least two bits of data, for example, the memory cell 312 includes a multi-level cell (MLC), the MLC may store two bits per memory cell, or store three bits per memory cell (also referred to as triple level cell (TLC)), or store four bits per memory cell (also referred to as quad level cell (QLC)). Each MLC may be programmed to take the range of possible nominal stored values.

Each memory string 311 also includes an upper select transistor 313 and a lower select transistor 314 for activating the selected memory string when the memory cell is erased, programmed, or erased. The upper select transistor 313 is also referred to as a top select gate (TSG) and the lower select transistor 314 is also referred to as a bottom select gate (BSG).

The memory 103 also includes a plurality of drain select lines (DSLs) 350, each DSL 350 is coupled to the upper select transistor 313 in at least one memory string 311. As shown in FIG. 2, upper select transistor 313 with the same height or similar height from the substrate carrier face in the plurality of memory strings 311 are coupled to the same DSL 350. Different DSLs are coupled to different memory strings 311. Such as schematic diagram of an electrical structure of a memory array according to an implementation of the present disclosure shown in FIG. 3, DSL0 is coupled to the TSGs of the plurality of memory strings 311 represented by the thin solid lines, and DSL1 is coupled to the TSGs of the plurality of memory strings 311 represented by the thick solid lines.

The memory 103 further includes a plurality of source select lines (SSL) 360, each SSL 360 is coupled to a lower select transistor 314 in at least one memory string 311. As shown in FIG. 2, the lower select transistors 314 with the same height or similar height from the substrate carrier face in the plurality of memory strings 311 are coupled to the same SSL 360. Different SSLs are coupled to different memory strings 311, taking SSL0 and SSL1 in FIG. 3 as an example, SSL0 is coupled to BSG of the plurality of memory strings 311 represented by the thin solid line, and SSL1 is coupled to BSG of the plurality of memory strings 311 represented by the thick solid line.

In some other implementations, as shown in FIG. 2, each memory string 311 further includes a dummy cell, and there is at least one dummy cell on each memory string 311. In FIG. 2, the dummy cell is located between the memory cell and the TSG and between the memory cell and the BSG. In some other implementations, the dummy cell may also be located between the memory cells 312, and a position of the dummy cell in the memory string 312 is not limited herein. A plurality of the dummy cells in the same layer of the plurality of memory strings 311 are coupled to a same dummy word line (DWL). The dummy cell is optional, In some implementations, the memory string 311 may not include the dummy cell, and in this implementation, the memory 103 does not include the DWL.

Figure 3:
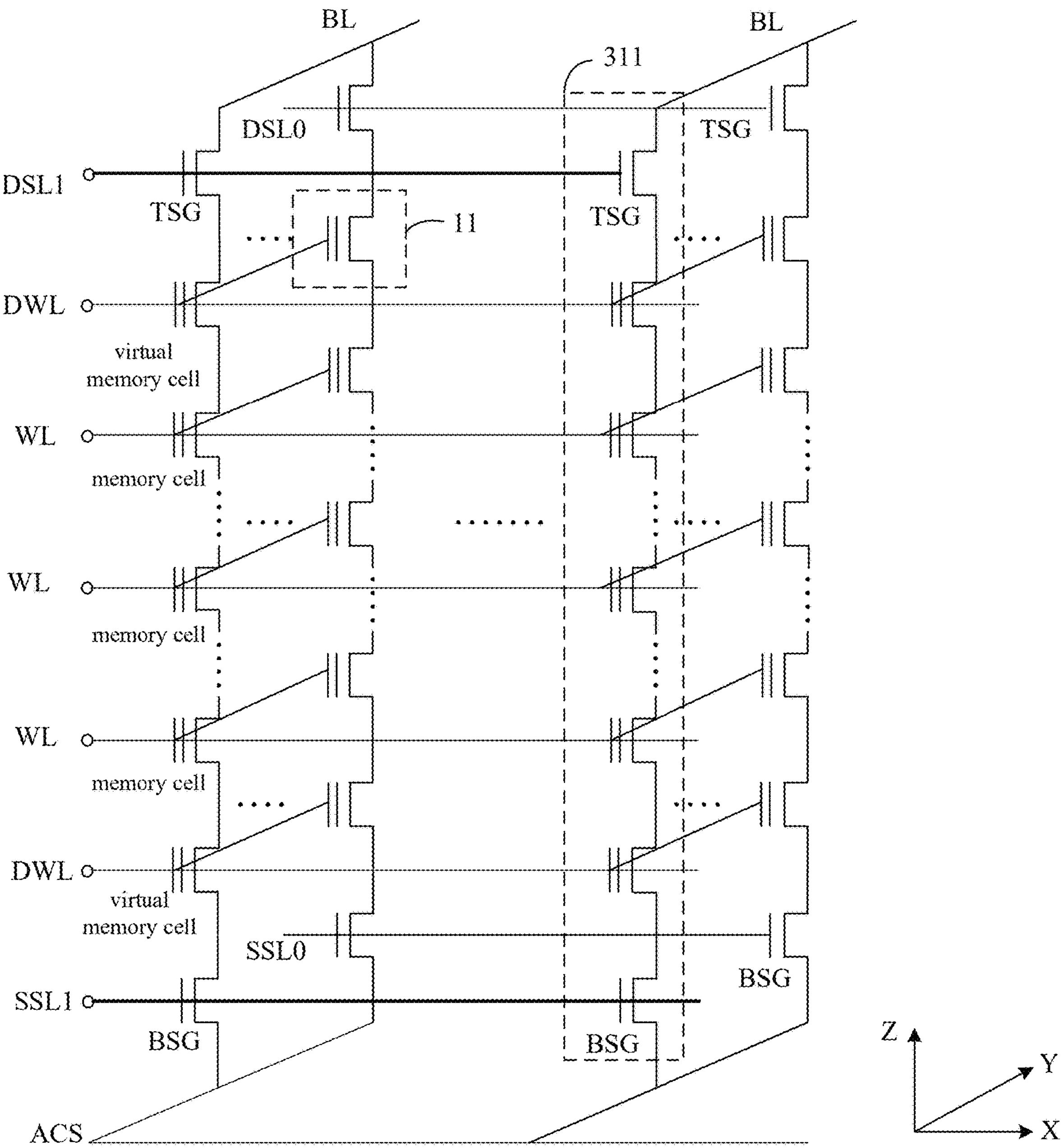
FIG. 3 is a schematic diagram of an electrical structure of a memory array, according to an implementation of the present disclosure.

One end of each memory string 311 is coupled to BL 320, taking FIG. 3 as an example, one BL may be coupled to the plurality of memory strings 311. The other end of each memory string 311 is coupled to an array common source (ACS) 370. For example, the other end of each memory string 311 is coupled to a semiconductor layer, and ACS 370 is also coupled to the semiconductor layer. The semiconductor layer may be a substrate, or may not be a substrate. For example, In some implementations, the substrate may be maintained to be connected to the source, and the substrate is a semiconductor layer. In some other implementations, the substrate may be removed and a new semiconductor layer is formed as the source. The plurality of memory strings 311 may be coupled to the same ACS 370. One end of the memory string 311 which is coupled to BL 320 may be referred to as a drain terminal of the memory string 311, and one end of the memory string 311 which is coupled to ACS 370 may be referred to as a source terminal of the memory string 311.

As shown in FIG. 2, the memory cells 312 with the same height or similar height from the substrate carrier face in different memory strings 311 are in the same layer, and the memory cells 312 in the same layer form a memory cell row 31*a*, that is, the memory array 310 includes a plurality of memory cell rows, and the plurality of word lines 330 are respectively coupled to the plurality of memory cell rows. All memory strings 311 sharing a same set of word lines in the memory array 310 form a memory block 31*b*. As shown in FIG. 3, the source terminals of each memory string 311 in the same memory block 31*b* are all coupled to the same ACS. The source terminals of the each memory strings 311 in the same memory block 31*b* are powered by the ACS.

In summary, the memory string 311 includes a plurality of cells, and according to different functions, the plurality of cells are divided into three category of cells such as a select gate, a dummy cell, and a memory cell, where the select gate is divided into TSG and BSG. In some implementations, the select gate and the dummy cell are referred to as a special cell in the memory string, and a connection line to which the drain of the special cell is coupled is referred to as a special word line. For example, the select line (e.g., DSL 350, SSL 360) to which the select gate is coupled and the DWL to which the dummy memory cell is coupled are both special word lines. The memory cell is referred to as a non-special cell in a memory string, and a word line to which the memory cell is coupled is referred to as a non-special word line.

The peripheral circuitry 340 includes various types of peripheral circuit formed by metal-oxide-semiconductor (MOS) technology. For example, FIG. 4 is a schematic structural diagram of a peripheral circuit according to an implementation of the present disclosure. As shown in FIG. 4, the peripheral circuit 340 includes a page buffer/sense amplifier 404, a column decoder/bit line (BL) driver 406, a row decoder/word line (WL) driver 408, a voltage generator 410, a control logic unit 412, a register 414, an interface 416, and a data bus 418. In some implementations, the peripheral circuit further includes additional peripheral circuit not shown in FIG. 4. The page buffer/sense amplifier 404 may be configured to read data from the memory array 310 and program (write) data to the memory array 310 according to the control signals from the control logic unit 412. In one implementation, the page buffer/sense amplifier 404 may store a page of programming data (write data) to be programmed into one page of the memory array 310. In another example, the page buffer/sense amplifier 404 may execute a program verification operation to ensure that the data has been correctly programmed into the memory cell 312 coupled to the selected word line. In yet another example, the page buffer/sense amplifier 404 may also sense a low power signal from the bit line representing a data bit stored in the memory cell 312, and amplify the small voltage swing to an identifiable logic level in a read operation. The column decoder/bit line driver 406 may be configured to be controlled by the control logic unit 412 and select one or more memory strings 311 by applying a bit line voltage generated from the voltage generator 410.

The row decoder/word line driver 408 may be configured to be controlled by the control logic unit 412 and select/deselect the word line 330 of the memory block 31*b* of the memory array 310 to select/deselect the block 31*b* of the memory block 31*b*. The row decoder/word line driver 408 may also be configured to drive the word line using the word line voltage generated from the voltage generator 410. In some implementations, the row decoder/word line driver 408 may also select/deselect and drive DSL and SSL. As described in detail below, the row decoder/word line driver 408 is configured to execute an erase operation on the memory cells 312 coupled to the selected word line(s). The voltage generator 410 may be configured to be controlled by the control logic unit 412 and generate word line voltages (e.g., read voltages, program voltages, pass voltages, local voltages, verification voltages, etc.), bit line voltages, and source line voltages (e.g., voltages of the ACS) to be supplied to the memory array 310.

The control logic unit 412 may be coupled to each peripheral circuit 340 described above and configured to control the operation of each peripheral circuit 340. The registers 414 may be coupled to the control logic unit 412 and include status registers, command registers, and address registers for storing status information, command operation codes (OP codes), and command addresses for controlling the operation of each peripheral circuit 340. The register 414 may further include at least one of a first register, a second register, and a third register described below. The functions of the first register, the second register, and the third register are described below, and details are not described herein again.

The interface 416 may be coupled to control logic unit 412 and serve as a control buffer to buffer control commands received from a host (not shown) and relay it to the control logic unit 412 and buffer status information received from control logic unit 412 and relay it to the host. Interface 416 may also be coupled to the column decoder/bit line driver 406 via data bus 418 and serve as a data I/O interface and a data buffer to buffer data and relay it to the memory array 310 or buffer data or relay data from the memory array 310.

The memory block 31*b* in the memory 103 supports an erase operation including a plurality of sub-operations such as a pre-program operation, an erase sub-operation, and an erase verification operation, where the pre-program operation is a program operation executed on the memory cell in the memory block before the memory block is erased, that is, the program operation before the erase, and the purpose of the pre-program operation is to set the threshold voltages of all the memory cells in the memory block to a preset voltage, so that all the memory cells in the memory block have the same program depth (that is, the same start point for erasing). The pre-program operation is an optional sub-operation in an erase operation. In some implementations, the erase operation does not include a pre-program operation. The erase sub-operation is configured to erase data stored in each memory cell in the memory block. The erase verification operation is configured to verification whether each memory cell in the memory block is successfully erased. In some implementations, an execution time period of the pre-program operation in the erase operation process is referred to as a pre-program phase or a pre-program operation process, an execution time period of the erase sub-operation in the erase operation process is referred to as an erase pulse phase or an erase sub-operation process, and an execution time period of the erase verification operation in the erase operation process is referred to as an erase verification phase or an erase verification operation process.

The peripheral circuit 340 may execute an erase sub-operation on the memory block 31*b* in a gate induced drain leakage (GIDL) erase manner. It is assumed that the erase sub-operation is executed on a memory block in the memory array in the t1-t4 time period, where the t1-t4 time period includes time t1, t2, t3, and t4, and t4>t3>t2>t1. The erase sub-operation in the GIDL erase manner is described below with reference to the waveform diagram shown in FIG. 5.

Figure 5:
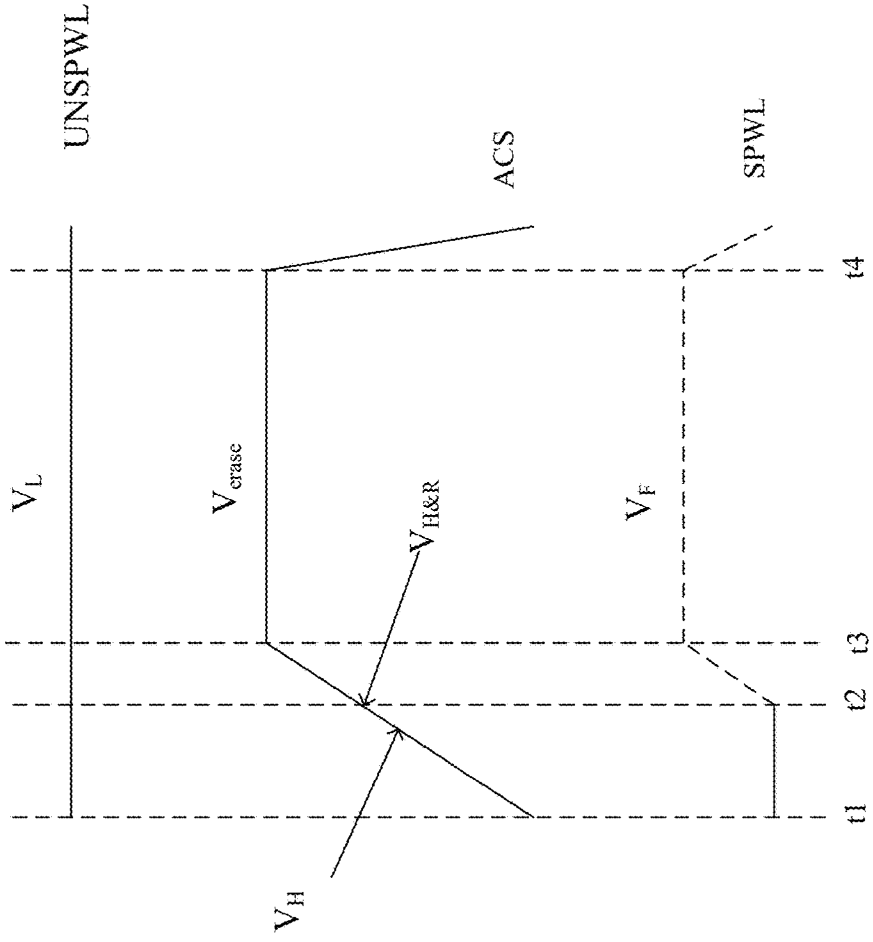
FIG. 5 is a voltage waveform diagram of an erasing process, according to an implementation of the present disclosure.

At time t1, an erase voltage $V_{erase}$ is applied to the ACS (and/or BL) to which the memory block is connected (i.e., coupled) until at time t4 stops applying the erase voltage $V_{erase}$. A value range of the erase voltage $V_{erase}$ may be 0V~15V, FIG. 5 is an example of applying an erase voltage $V_{erase}$ to the ACS, the voltage waveform of the ACS is shown in FIG. 5. The voltage of the ACS continuously rises from the initial voltage at the time period of t1 to t3, until the voltage of the ACS rises to the erase voltage $V_{erase}$ at time t3, the voltage of the ACS is maintained at the erase voltage $V_{erase}$ at the time period t3 to t4, at time t4, stop applying the erase voltage $V_{erase}$ and the voltage of the ACS continuously decreases until decreases to the initial voltage of the ACS.

Starting from time t1, a voltage of 0V is applied to each special word line (WL) (SPWL) to which each memory string in the memory block is connected, so that the voltage of the SPWL is maintained at 0V, and the voltage of the ACS (and/or BL) is detected. When the voltage of the ACS (and/or BL) is detected to be equal to the hold released voltage $V_{H\&R}$, the voltage of the SPWL is released, that is, when the voltage of the ACS (and/or BL) rises to the hold released voltage $V_{H\&R}$, the voltage of the SPWL is released. For example, assuming that the voltage of the ACS is detected to be equal to the hold released voltage $V_{H\&R}$ at time t2, the voltage of the SPWL is released, so that the SPWL starts to float, after time t2, the SPWL is always in a floating state, and during the SPWL remains in the floating state, the voltage of the SPWL changes with the voltage of the ACS by capacitor coupling. For example, starting from time t2, the voltage of the SPWL continuously rises with the voltage of the ACS until the voltage of the SPWL rises to the voltage $V_F$ at time t3, the voltage of the SPWL is maintained at the voltage $V_F$ at the time period of t3 to t4, and after time t4, the voltage of the SPWL continuously decreases with the voltage of the ACS.

The hold released voltage $V_{H\&R}$ is the voltage of the ACS (and/or BL voltage) that triggers the release of the voltage of the special word line during the erase pulse phase, the hold released voltage $V_{H\&R}$ is greater than 0V and less than the erase voltage $V_{erase}$, and the voltage $V_F$ is less than or approximately equal to the erase voltage $V_{erase}$.

In the time period of t1 to t4, a low voltage $V_L$ is continuously applied to a non-special word line (UNSPWL) to which a memory cell of each memory strings in the memory block is connected, so that the voltage of the UNSPWL is maintained at a low voltage $V_L$ in the time period of t1 to t4, where a value range of the low voltage $V_L$ is 0~1V, the voltage difference ΔV between the UNSPWL and the ACS (and/or BL) (that is, $V_{erase}-V_L$) is greater than the threshold voltage $V_{th}$ of a memory cell connected to the UNSPWL, and under the effect of the voltage difference ΔV, the electrons stored in the memory cell are removed, so that the memory cell is set to the erased state, and data erase is completed.

In some implementations, during the erase operation process, the memory controller 102 may also control the memory 103 to execute other operations, which may be any operation supported by the memory block other than the erase operation, such as a data read operation or a program operation. Taking data read operations (as an example of the other operations) as an example, in the process of executing the erase operation on a memory block by the memory 103, if the memory controller 102 receives a data read request from the host 101, the memory controller 102 controls the memory 103 to suspend the currently executed erase operation (possibly any one sub-operation of the erase operation) based on the data read request, the control memory 103 executes a data read operation, and after the data read operation is completed, controls the memory 103 to resume executing the suspended erase operation. For example, the memory controller 102 first sends an erase suspend instruction to the memory 103 to instruct the memory 103 to suspend the erase operation, the memory 103 receives the erase suspend instruction, and suspends the currently executed erase operation based on the erase suspend instruction. After the erase suspend instruction is sent, the memory controller 102 controls the memory 103 to execute a data read operation to read data from the memory 103. After the data read is completed, an erase resume command is sent to the memory 103 to indicate resuming the erase operation, the memory 103 receives the erase resume command, and resumes executing the suspended erase operation based on the erase resume command. When the other operation is a program operation, the process of controlling the memory 103 to execute the program operation during the erase operation is similar to the process of controlling the memory 103 to execute the data read operation during the erase operation, and details are not described herein again.

For the erase operation executed on any memory block, during any sub-operation process of the erase operation, each time the erase suspend command for the memory block is received, the memory 103 suspends the sub-operation (that is, suspends the currently executed erase operation), and resumes the sub-operation (that is, resumes executing the suspended erase operation) when the erase resume instruction for the memory block is received.

Taking the erase sub-operation in the erase operation as an example, each time the erase sub-operation is resumed, the ACS (and/or BL), the SPWL and the UNSPWL to which the corresponding memory block is connected are applied the erase voltage $V_{erase}$, the voltage of 0V and the low voltage $V_L$, respectively, and when the voltage of the ACS rises to the hold released voltage $V_{H\&/R}$, the voltage of the SPWL is released. As shown in FIG. 5, each time the erase voltage $V_{erase}$ is applied, when the voltage of the ACS reaches the high voltage $V_H$ ($V_H<V_{H\&R}$), the voltage of the SPWL is maintained at 0V, if the high voltage $V_H$ is greater than the threshold voltage $V_{th}$ of the special unit to which the SPWL is coupled, a small amount of the electrons stored in the special unit are removed, so that the threshold voltage $V_{th}$ of the special unit is decreased, and the special unit is weakly erased. In order to ensure the function of a special cell, it is not expected that the threshold voltage $V_{th}$ of a special memory cell is decreased, and weak erase of a special cell results in degradation of memory stability and performance.

Figure 6:
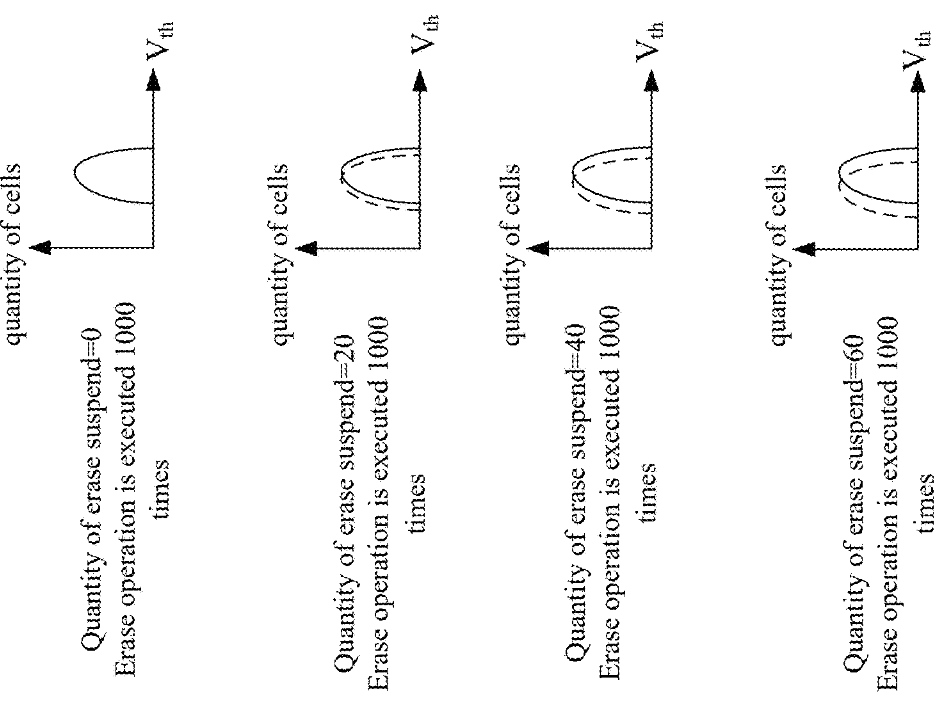
FIG. 6 is a schematic diagram of threshold voltage distribution of a special cell, according to an implementation of the present disclosure.

During the erase pulse phase (i.e., the erase sub-operation process) in the erase operation, if the memory 103 receives the erase suspend command for the memory block for multiple times, the memory 103 may suspend the erase sub-operation for multiple times, and may also resume the erase sub-operation for multiple times. The quantity that the erase operation is suspended in the erase pulse phase is referred to as the quantity of erase suspends, as shown in FIG. 6, when there is a certain quantity of erase suspends for the erase operation of the memory block, the threshold voltage $V_{th}$ of the special cell in the memory block is shifted to the left as the quantity of erase operations executed on the memory block is increased, for example, assuming that 1000 erase operations are executed on the memory block, if for each erase operation the quantity of erase suspends in the erase pulse phase is 0, the threshold voltage $V_{th}$ of the special cell is not shifted, and if for each erase operation the quantity of erase suspends in the erase pulse phase is 20, the threshold voltage $V_{th}$ of the special cell will be shifted to the left. When the same quantity of erase operations is executed on the memory block, the threshold voltage $V_{th}$ of the special cell in the memory block may be shifted further to the left as the quantity of erase suspends in the erase pulse phase for the erase operation increases. For example, assuming that 1000 erase operations are executed on the memory block, compared to the case where for each erase operation the quantity of erase suspends is 20, the threshold voltage $V_{th}$ of the special cell is shifted further to the left when the quantity of erase suspends for each erase operation is 40 or 60. The further the threshold voltage $V_{th}$ of the special cell is shifted to the left, the lower the threshold voltage $V_{th}$ of the special cell, the worse the weak erase occurs in the special cell, resulting in a lower memory stability and performance.

Therefore, for the erase sub-operation of any memory block, the present disclosure counts the quantity of erase suspends in the erase pulse phase for the memory blocks, and when the quantity of erase suspends reaches a certain quantity, the voltage of the SPWL is released in advance in the resume phase after the erase sub-operation is suspended (referred to as the resume of the erase suspend phase), so that the SPWL can float in advance, and the voltage of the SPWL may increase in advance along with the increase of the voltage of the ACS, thereby reducing the voltage difference ΔV between the SPWL and the ACS in the resume of the erase suspend phase, and weakening or even avoiding the weak erase phenomenon of the special unit.

In some implementations, the peripheral circuit 340 includes a first register configured to store the quantity of erase suspends. For example, the first register is configured to store the quantity of erase suspends of the plurality of memory blocks, and initially, the quantity of erase suspends of the plurality of memory blocks is 0, and every time when the erase sub-operation of any one of the memory blocks is suspended, the quantity of erase suspends corresponding to the memory block in the first register are increased by 1, so as to count the quantity of erase suspends of the memory blocks.

In some implementations, the peripheral circuit 340 may further determine whether the quantity of erase suspends of the memory block reaches a certain quantity by a threshold. For example, if the quantity of erase suspends is greater than or equal to the threshold, it indicates that the quantity of erase suspends reaches a certain quantity, and if the quantity of erase suspends is less than the threshold, it indicates that the quantity of erase suspends does not reach a certain quantity. The threshold is greater than or equal to 20 and less than or equal to 60, that is, the value range of the threshold is 20~60, the threshold may be any integer in 20 to 60, in other implementations, the threshold may also be less than 20 or greater than 60, and for different products or different application scenarios, the values of the thresholds are different, and the threshold is not limited in the implementations of this application.

In some implementations, the peripheral circuit 340 includes a second register configured to store the threshold, so that when executing the method for operating provided in this application, the threshold can be obtained from the second register.

In some implementations, the peripheral circuit 340 may further indicate, by a erase count flag, whether the quantity of erase suspends of the memory block reaches the threshold, where the erase count flag may be the first flag or the second flag, when the quantity of erase suspends of any one of the memory blocks is less than the threshold, the erase count flag of the memory block is the first flag, and when the quantity of erase-suspends is greater than or equal to the threshold, the erase count flag of the memory block is the second flag, in other words, the first flag and the second flag are different erase count flags, the first flag indicates that the quantity of erase suspends of the memory block does not reach the threshold, and the second flag indicates that the quantity of erase suspends of the memory block reaches the threshold. The first flag and the second flag may be represented by different numerical values, for example, the first flag is 0, the second flag is 1, or the second flag is 0, the first flag is 1, and in this application, the manner of representing the first flag and the second flag is not limited in the implementation of this application.

In some implementations, the peripheral circuit 340 includes a third register configured to store an erase count flag of the plurality of memory blocks, so that when executing the method for operating provided in this application, the erase count flag of the corresponding memory block may be obtained from the third register. For example, the erase count flag of the plurality of memory blocks is stored in the third register, and initially the erase count flag of the plurality of memory blocks is the first flag, and when the quantity of erase suspends of a memory block reaches the threshold, the erase count flag of the memory block in the third register may be updated to the second flag.

The erase count flag is an optional parameter, and the third register is an optional register. In some other implementations, whether the quantity of erase suspends reaches the threshold is determined by the quantity of erase suspends, and it is not necessary to determine whether the quantity of erase suspends reaches the threshold by the erase count flag, and in this implementation, the peripheral circuit 340 does not need to include the third register. The first register, the second register, and the third register described above may be the same register or different registers.

Next, a flow of the method for operating a memory according to this application is described with reference to FIG. 7 based on the erase operation and parameters such as the quantity of erase suspends, the threshold, and the erase count flag described above, and the memory may be the memory 103 described above, and the method may be executed by the peripheral circuit 340 in the memory 103. The method includes operations 701, 702, 703, 704, and 705.

At 701, execute an erase operation on a memory block in the memory, and set a quantity of erase suspends of the memory block to 0.

The memory block is any memory block in the memory array of the memory, and the memory block and the memory array are described above, and details are not described herein again.

Taking the memory system 100 in FIG. 1 as an example, when there is a data erase requirement for a certain memory block in the memory 103, the memory controller 102 sends a data erase instruction to the memory 103, where the data erase instruction indicates executing an erase operation on the memory block, the peripheral circuit 340 in the memory 103 receives the data erase command, and executes an erase operation on the memory block based on the indication of the data erase command. For example, assuming that the erase operation includes a pre-program operation, an erase operation, and an erase verification operation, executing an erase operation on the memory block includes executing a pre-program operation on the memory block, then executing an erase sub-operation on the memory block, and then executing an erase pre-program operation on the memory block.

Before executing the erase operation on the memory block or executing the erase sub-operation in the erase operation on the memory block, the quantity of erase suspends of the memory block in the first register is set to 0 to prepare the count for the quantity in the erase pulse phase for the memory block. After the erase pre-program operation is executed on the memory block, the erase sub-operation is executed on the memory block, and if the erase suspend instruction is not received during the erase sub-operation process, the erase sub-operation continues to be executed until the erase sub-operation is completed, and then the erase verification operation is executed. If the erase suspend instruction is received during the erase sub-operation, the following operations 702 to 704 are executed, or the following operations 701, 702, and 705 are executed.

At 702, in response to the erase suspend command in the erase pulse phase, suspend the erase operation, increase the quantity of erase suspends of the memory block to obtain an increased quantity of erase suspends, and the erase suspend command indicates to suspend the erase operation.

The erase pulse phase refers to the execution time period of the erase sub-operation in the erase operation process, the erase suspend command in the erase pulse phase refers to the erase suspend command received in the erase pulse phase, the erase suspend command in the erase pulse phase refers to the erase suspend command received in the erase pulse phase of the erase operation, and the erase operation suspended in response to the erase suspend command in the erase pulse phase is an erase sub-operation.

Still taking the memory system 100 shown in FIG. 1 as an example, after the memory controller 102 sends the erase data command to the memory, if the memory controller 102 has a requirement to execute other operations (such as a program operation or a data read) on the memory 103, the memory controller 102 sends an erase suspend command to the memory 103 to indicate to suspend the erase operation. The peripheral circuit 340 in the memory 103 receives the erase suspend command, the peripheral circuit 340 suspends the erase operation currently executed on the memory block (referred to as the current erase operation for short) in response to the erase suspend command, and determines whether the current erase operation is an erase sub-operation. If the current erase operation is an erase sub-operation, the peripheral circuit 340 determines that the memory block is in the erase pulse phase, the received erase suspend command is an erase suspend command in the erase pulse phase, and increases the quantity of erase suspends of the memory block. If the current erase operation is not an erase sub-operation (such as a pre-program operation or an erase verification operation), the received erase suspend command is not the erase suspend command in the erase pulse phase, and does not increase the quantity of erase suspends of the memory block.

Taking the control logic unit 412 in the peripheral circuit 340 to execute the erase operation on the memory block as an example, before starting to execute the erase sub-operation on the memory block, the control logic unit 412 first sets the quantity of erase suspends of the memory block in the first register to 0, in response to the erase suspend command in the erase pulse phase, suspends the erase sub-operation, and adds 1 to the quantity of erase suspends of the memory block in the first register. In response to each erase suspend command in the erase pulse phase, the erase sub-operation is suspended once, and the quantity of erase suspends of the memory block in the first register is increased by 1, so as to count the quantity of erase suspends in the pulse phase, so as to determine whether to release the voltage of the special unit in advance based on the accumulated quantity of erase suspends in the erase resume phase.

In some implementations, the control logic unit 412 further updates the erase count flag corresponding to the memory block according to the quantity of erase suspends of the memory blocks. For example, before executing the erase operation on the memory block or executing the erase sub-operation, the control logic unit 412 sets the erase count flag of the memory block in the third register to the first flag to indicate that the current quantity of erase suspends of the memory block does not reach the threshold.

Every time the quantity of erase suspends of the memory block is increased, an increased quantity of erase suspends is obtained, and then the erase count flag of the memory block is updated to the second flag in response to the increased quantity of erase suspends being equal to the threshold. For example, the control logic unit 412 adds 1 to the quantity of erase suspends of the memory block to obtain the increased quantity of erase suspends, compares the increased quantity of erase suspends with the threshold in the second register, and if the increased quantity of erase suspends is equal to the threshold, updates the erase count flag of the memory block in the third register to the second flag to indicate that the quantity of erase suspends of the memory block reaches the threshold.

Since the quantity of erase suspends of the memory block is indicated to reach the threshold by the second flag, subsequently, if the erase resume command is received again in the erase pulse phase, the control logic unit 412 may not execute the operation of increasing the quantity of erase suspends corresponding to the memory blocks, and no longer updates the erase count flag of the memory block in the third register, so as to reduce the workload of the control logic unit 412. Of course, in some implementations, if the erase resume command for the memory block is received again in the erase pulse phase, the control logic unit 412 may execute the operation of increasing the quantity of erase suspends of the memory block, which is not limited in the implementation of this application.

Figure 8:
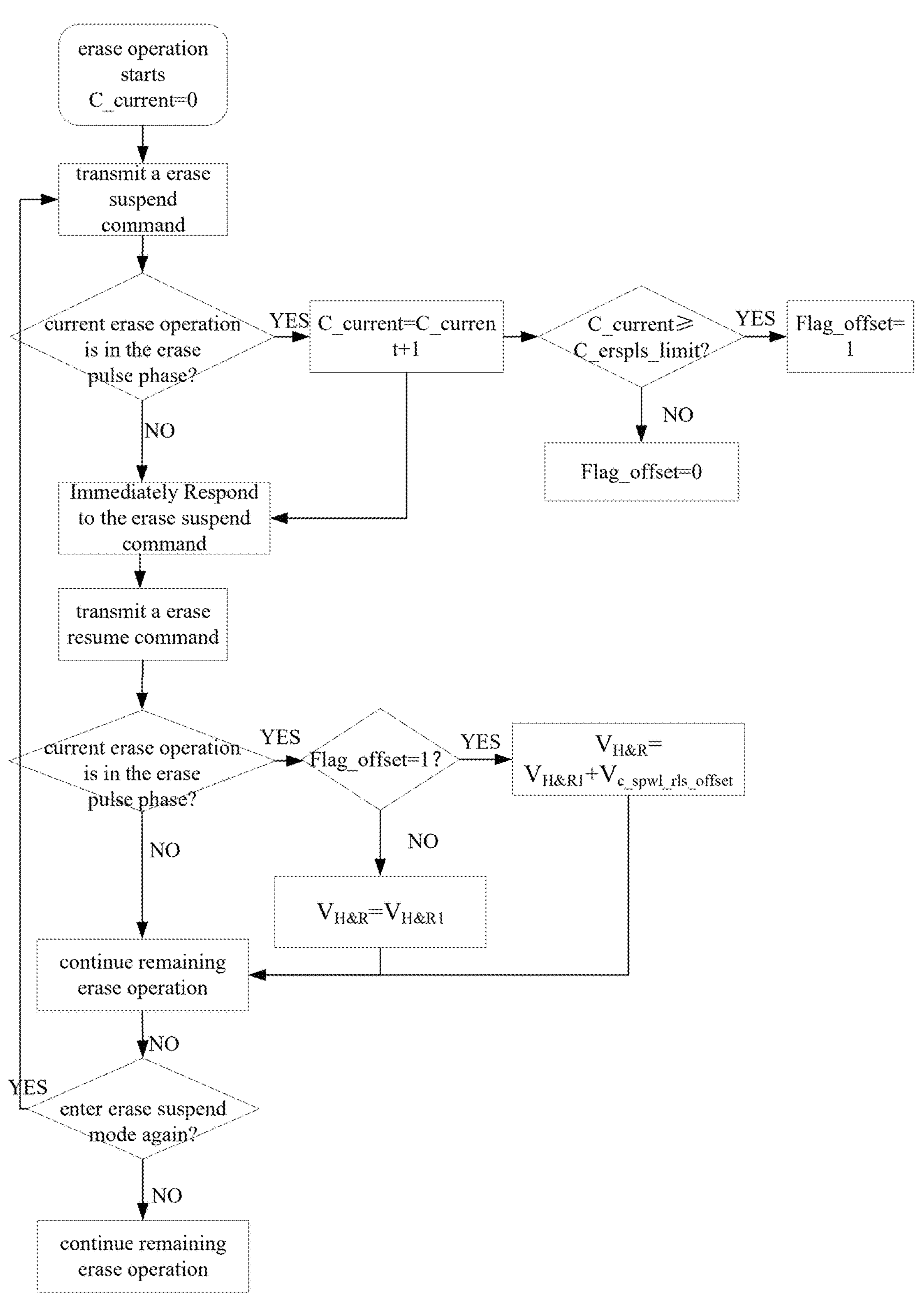
FIG. 8 is a flowchart illustrating a complete erasing operation of a memory, according to an implementation of the present disclosure.

Taking FIG. 8 as an example, when a data erase command for a certain memory block is received, an erase operation is executed on the memory block, and before the erase operation is started, the peripheral circuit 340 sets the quantity of erase suspends C_current of the memory block to 0 (i.e., C_current=0), and then executes an erase operation on the memory block, and during the erase operation, the memory controller 102 sends an erase suspend command for the memory block to the memory 103. The peripheral circuit 340 in the memory 103 receives the erase suspend command, determines whether the current erase operation is in the erase pulse phase, and if the current erase operation is not in the erase pulse phase, immediately suspends the current erase operation, so as to immediately respond to the erase suspend command, and the current erase operation is a pre-program operation or an erase verification operation. If the current erase operation is in the erase pulse phase, the quantity of erase suspends C_current of the memory block (that is, C_current=C_current+1) is increased by 1 to obtain a new quantity of erase suspends C_current, and the current erase operation is immediately suspended, so as to immediately respond to the erase suspend command, and the current erase operation is an erase operation. Certainly, if the current erase operation is in the erase pulse phase, the erase suspend command may also be immediately responded to, and then the quantity of erase suspends C_current of the memory block are increased by 1, or the two operations are performed simultaneously, and the execution sequence of the two operations is not limited herein. In addition, after the new quantity of erase suspends C_current is obtained, whether the new quantity of erase suspends C_current is greater than or equal to the threshold C_ersplit_limit is determined, and if the new quantity of erase suspends C_current is greater than or equal to the threshold C_ersplit_limit, the erase count flag Flag_offset of the memory block is set to the first flag "0" (i.e., Flag_offset=0), and if the new quantity of erase suspends C_current is greater than or equal to the threshold C_ersplit_limit, the erase count flag Flag_offset of the memory block is set to the second flag "1" (i.e., Flag_offset=1). Certainly, the erase count flag Flag_offset of the memory block may be set to the first flag "0" before the erase operation is started, and after the new quantity of erase suspends C_current is obtained, if the new quantity of erase suspends C_current is greater than or equal to the threshold, the erase count flag Flag_offset of the memory block is set to the second flag "1".

When the erase suspend command is received in the erase pulse phase, FIG. 8 shows an implementation in which the operation of adding 1 to C_current is executed first, and then the operation of determining whether C_current is greater than or equal to C_ersplit_limit is executed, and then the operation of setting the Flag_offset according to the determination is executed. In some other implementations, the operation of determining whether C_current is greater than or equal to C_ersplit_limit may be executed first, and then the operation of setting the Flag_offset according to the determination and the operation of adding 1 to C_current may be executed simultaneously or sequentially, and the execution sequence of these three operations is not limited in the implementation of this application. For these three operations, FIG. 8 shows an implementation in which the operation of executing responding to the erase suspend command after the operation of determining whether C_current is greater than or equal to C_ersplit_limit is completed, and in other implementations, the operation of responding to the erase suspend command may be executed after any one of these three operations are executed, after any two operations of these three operations are executed, or after three operations of these three operations are executed. Alternatively, after it is determined that the current erase operation is in the erase pulse phase, the operation of responding to the erase suspend command is executed first, and then the operation of responding to the erase suspend command and these three operations are executed simultaneously or sequentially. The operation of responding to the erase suspend command and the execution sequence of these three operations are not limited in the implementation of this application.

At 703, receive an erase resume command, where the erase resume command indicates a resume of the erase operation on the memory block in the memory.

After the memory 103 suspends the erase operation, the memory controller 102 controls the memory 103 to execute other operations (such as a program operation or a data read operation), after other operations are executed, the memory controller 102 sends an erase resume command for the memory block to the memory 103, the peripheral circuit 340 in the memory 103 receives the erase resume command, and resumes the erase operation on the memory block based on the indication of the erase resume command. For example, in response to the erase operation being in the pre-program phase, the pre-program operation on the memory is resumed, in response to the erase operation being in the erase verification phase, the erase verification operation on the memory block is resumed, and in response to the erase operation being in the erase pulse phase, the erase sub-operation on the memory block is resumed.

Figure 9:
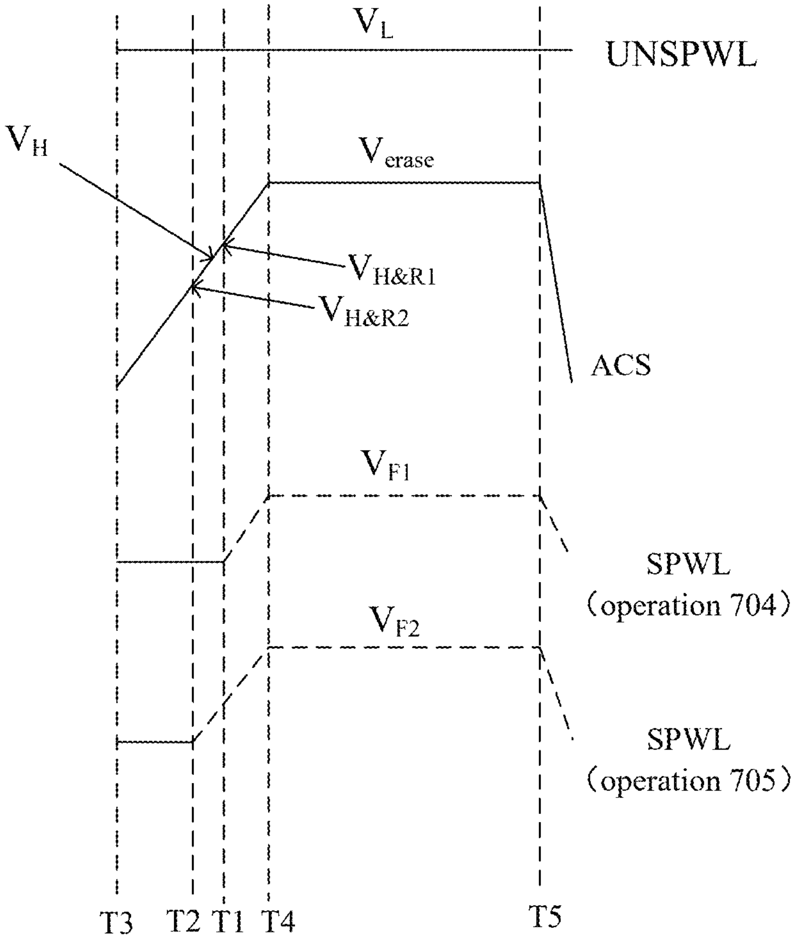
FIG. 9 is a voltage waveform diagram of another erasing process, according to an implementation of the present disclosure.

As shown in FIG. 9, resuming the erase sub-operation on the memory block includes applying the erase voltage $V_{erase}$ to the ACS (and/or BL) to which the memory block is connected at the third time (denoted as T3), so that the voltage of the ACS (and/or BL) starts to rise from the third time T3 until the voltage of the ACS rises to the erase voltage $V_{erase}$ at the fourth time (denoted as T4), and the voltage of the ACS maintains at the erase voltage $V_{erase}$ during the time period from the fourth time to the fifth time (denoted as T5), and the erase voltage $V_{erase}$ is applied at the end of the fifth time. In addition, a low voltage $V_L$ is applied to a word line (that is, UNSPWL) to which each memory cell is connected in the memory block at a time period from the third time to the fifth time, where the third time is a time at which the erase sub-operation is resumed, the third time is earlier than the fourth time, and the fourth time is earlier than the fifth time, that is, T5>T4>T3.

Resuming the erase sub-operation to the memory block also includes the following operation 704 or operation 705. Before operation 704 or operation 705 is executed, the quantity of erase suspends of the memory blocks are compared with the threshold, and then operation 704 or operation 705 is executed according to the comparison. For example, if the quantity of erase suspends is less than the threshold, operation 704 is executed; if the quantity of erase suspends is greater than or equal to the threshold, operation 705 is executed.

At 704, if the erase operation is in the erase pulse phase, in response to the quantity of erase suspends of the memory block being less than the threshold, releasing the voltage of the special word line to which the memory block is connected at the first time, where the quantity of erase suspends refers to the quantity the erase operation is suspended in the erase pulse phase.

The erase pulse phase refers to an execution time period of an erase sub-operation in an erase operation, and the first time is a time at which a special word line voltage is released when the quantity of erase suspends of the memory block is less than the threshold, and the first time may be a time when the voltage of the ACS (and/or BL) is equal to the third voltage in the erase sub-operation process. The third voltage is greater than the threshold voltage $V_{th}$ of the at least one memory cell in the memory block and less than the erase voltage $V_{erase}$, the third voltage is the hold released voltage $V_{H\&R}$ when the quantity of erase suspends of the memory block is less than the threshold, the third voltage may also be referred to as the first hold release voltage $V_{H\&/R1}$, and the first hold released voltage $V_{H\&/R1}$ may be the hold released voltage $V_{H\&R}$ in FIG. 5.

If the quantity of erase suspends of the memory block is less than the threshold, it indicates that the weak erase of the special cell in the memory block is not enough to affect the memory reliability and performance, and the voltage of the special word line is normally released without adjusting the hold released voltage $V_{H\&/R}$.

In the process of resuming the erase sub-operation, the voltage of 0V is continuously applied to each special word line (SPWL) to which the memory block is connected from the third time, so that the voltage of the SPWL is maintained at 0V, and it is detected whether the voltage of the ACS (and/or BL) rises to the third voltage (e.g., $V_{H\&/R1}$), for example, if it is detected that the voltage of the ACS is less than the third voltage, it indicates that the voltage of the ACS (and/or BL) does not rise to the third voltage, and if it is detected that the voltage of the ACS (and/or BL) is equal to the third voltage, it indicates that the voltage of the ACS (and/or BL) rises to the third voltage. When the voltage of the ACS (and/or BL) rises to the third voltage, the voltage of each SPWL to which the memory block is connected is released, so that each SPWL is in a floating state.

Taking applying the erase voltage $V_{erase}$ to the ACS, and the third voltage is the first hold released voltage $V_{H\&/R1}$ as an example, as shown in FIG. 9, in the process of resuming the erase sub operation, the voltage of the SPWL to which the memory block is connected is maintained at 0V from the third time T3, and the voltage of the SPWL to which the memory block is connected is immediately released when the voltage of the ACS rises to the first hold release voltage $V_{H\&/R1}$ in response to the quantity of erase suspends of the memory block being less than the threshold. The time when the voltage of the ACS rises to the first hold released voltage $V_{H\&/R1}$ is the first time (denoted as T1), that is, the voltage of the SPWL to which the memory block is connected is released at the first time T1, so that the SPWL is in the floating state, the voltage of the SPWL changes as the voltage of the ACS changes, for example, the voltage of the SPWL rises from the first time T1 until the voltage of the SPWL rises to the first voltage $V_{F1}$ at the fourth time T4, and the voltage of the SPWL is maintained at the first voltage $V_{F1}$ during the time period from the fourth time T4 to the fifth time T5, and after the fifth time T5, the voltage of the SPWL gradually decreases. The second time is later than the third time and earlier than the fourth time, that is, T3<T1<T4.

At 705, if the erase operation is in the erase pulse phase, in response to the quantity of erase suspends of the memory block being greater than or equal to the threshold, the voltage of the special word line to which the memory block is connected is released at the second time, and the second time is earlier than the first time.

The second time is a time when the voltage of the special word line is released when the quantity of erase suspends of the memory block is greater than or equal to the threshold, and the second time may be a time when the voltage of the ACS at the erase pulse phase is equal to the fourth voltage. The fourth voltage is less than the third voltage, for example, the fourth voltage is greater than the high voltage $V_H$ and less than the third voltage. The fourth voltage is the hold released voltage $V_{H\&R}$ when the quantity of erase suspends of the memory block is greater than or equal to the threshold, and the fourth voltage may be referred to as the second hold released voltage $V_{H\&R2}$. The second hold released voltage $V_{H\&R2}$ is less than the first hold released voltage $V_{H\&R1}$ and greater than 0V, as shown in FIG. 9, the second hold released voltage $V_{H\&R2}$ is less than the first hold released voltage $V_{H\&R1}$ may be expressed as the electric potential of the second hold released voltage $V_{H\&R2}$ being lower than the electric potential of the first hold released voltage $V_{H\&R1}$. The voltage difference between the first hold released voltage $V_{H\&R1}$ and the second hold released voltage $V_{H\&R2}$ is greater than 0V and less than or equal to 2V, alternatively, the voltage difference may also be greater than 2V, the voltage difference between the first hold released voltage $V_{H\&R1}$ and the second hold released voltage $V_{H\&R2}$ is not limited herein.

If the quantity of erase suspends of the memory block is greater than or equal to the threshold, it indicates that if the special cell in the memory block continues to be weakly erased, the reliability and performance of the memory may be reduced, and the second hold released voltage $V_{H\&R2}$ may be used as the hold released voltage $V_{H\&R}$, so as to release the voltage of the special word line in advance.

The second hold released voltage $V_{H\&R2}$ may be obtained by adjusting the first hold released voltage $V_{H\&R1}$. For example, the first hold released voltage $V_{H\&R1}$ is first decreased to obtain a decreased first hold released voltage $V_{H\&R1}$. For example, in response to the quantity of erase suspends being greater than or equal to the threshold, a negative voltage is applied to the first hold released voltage $V_{H\&R1}$, such that the first hold released voltage $V_{H\&R1}$ is decreased, and the decreased first retention release voltage $V_{H\&R1}$ is the second hold released voltage $V_{H\&R2}$. The negative voltage is less than 0V or greater than or equal to −2V, and certainly, the negative voltage may also be less than 2V, the range of the negative voltage is not limited herein.

In the process of resuming the erase sub-operation, the voltage of each special word line (SPWL) to which the memory block is connected is maintained at 0V from the third time, and whether the voltage of the ACS (and/or BL) rises to the fourth voltage is detected. For example, if it is detected that the voltage of the ACS is less than the fourth voltage (e.g., $V_{H\&R2}$), it indicates that the voltage of the ACS (and/or BL) does not rise to the fourth voltage yet, and if it is detected that the voltage of the ACS (and/or BL) is equal to the third voltage, it indicates that the voltage of the ACS (and/or BL) rises to the fourth voltage. When the voltage of the ACS (and/or BL) rises to the fourth voltage, the voltage of each SPWL to which the memory block is connected is released, so that each SPWL is in a floating state.

Taking the following as an example: the erase voltage $V_{erase}$ is applied to the ACS, and the fourth voltage is the second hold released voltage $V_{H\&R2}$, as shown in FIG. 9, the voltage of the SPWL to which the memory block is connected is maintained at 0V from the third time T3, and in response to the quantity of erase suspends being greater than or equal to the threshold, the voltage of the SPWL to which the memory block is connected is immediately released when the voltage of the ACS rises to the second hold released voltage $V_{H\&R2}$. The time when the voltage of the ACS rises to the second hold released voltage $V_{H\&R2}$ is the second time (denoted as T2), that is, the voltage of the SPWL to which the memory block is connected is released at the second time T2, such that the SPWL is in the floating state, the voltage of the SPWL changes as the voltage of the ACS changes, for example, the voltage of the SPWL rises from the second time T2 until the voltage of the SPWL rises to the second voltage $V_{F2}$, and the voltage of the SPWL during the time period from the fourth time T4 to the fifth time T5 is maintained at the second voltage $V_{F2}$, and after the fifth time T5, the voltage of the SPWL gradually decreases. The second time is later than the third time and earlier than the first time, that is, T3<T2<T1.

For ease of description, the time period during which the voltage of the SPWL is maintained constant after the SPWL is floating is referred to as the first time period, for example, the time period from the fourth time T4 to the fifth time T5 in FIG. 9. That is, when the voltage of the SPWL is released at the first time T1, the voltage of the SPWL is maintained at the first voltage $V_{F1}$ during the first time period after the first time T1; and when the voltage of the SPWL is released at the second time T2, the voltage of the SPWL is maintained at the second voltage $V_{F2}$ during the first time period, where the second voltage $V_{E2}$ is greater than the first voltage $V_{F1}$. Since the voltage of the SPWL continuously rises with the voltage of the ACS during the first time T1 to the fourth time T4 when the voltage of the SPWL is released at the first time T1, and the voltage of the SPWL continuously rises with the voltage of the ACS during the second time T2 to the fourth time T4 when the voltage of the SPWL is released at the second time T2, the first time length between the first time T1 to the fourth time T4 is greater than the second time length between the second time T2 and the fourth time T4, so that the voltage of the SPWL can rise more when the voltage of the SPWL is released at the second time T2, therefore, the second voltage $V_{F2}$ is greater than the first voltage $V_{F1}$.

As shown in FIG. 9, since the second hold released voltage $V_{H\&R2}$ is less than the first hold released voltage $V_{H\&R1}$, the voltage of the ACS in the erase sub-operation process firstly rises to the second hold released voltage $V_{H\&R2}$ at the second time T2, and then rises to the second hold released voltage $V_{H\&R2}$ at the first time T1. Therefore, instead of releasing the voltage of the SPWL when the voltage of the ACS rises to the first hold released voltage $V_{H\&R1}$, the voltage of the SPWL is released when the voltage of the ACS rises to the second hold released voltage $V_{H\&R2}$, so that the voltage of the SPWL is released at the second time T2 before the first time T1, that is, the voltage of the SPWL is released in advance, the SPWL enters the floating state in advance, so that the voltage of the SPWL changes in advance along with the change of the voltage of the ACS, so that the voltage of the SPWL has exceeded 0V before the voltage of the ACS reaches the high voltage $V_H$, the voltage difference between the ACS and the SPWL in the operation process of the erase sub-operation is prevented from being greater than the threshold voltage $V_{th}$ of the special unit, and the weak erase of the special unit during the currently resuming the erase sub-operation is prevented.

As shown in FIG. 9, the fifth time T5 is the end time of the currently resuming the erase sub-operation, the fifth time T5 may be the end time of the erase sub-operation, or may not be the end time of the erase sub-operation.

For example, the total execution time length of the erase sub-operation is referred to as the target time length, taking FIG. 5 as an example, the target time length=t4−t1, and the target time length is greater than the time length between the fifth time T5 and the third time T3 in FIG. 9 (that is, the target time length>T5−T3). The difference between the target time length and the time length in which the erase sub-operation has been executed is referred to as the remaining time length of the erase operation, and during the current process of resuming the erase operation, as shown in FIG. 9, the erase voltage $V_{erase}$ is applied from the third time T3 until the time length in which the erase voltage $V_{erase}$ is applied reaches the remaining time length, and it is assumed that the erase suspend command is not received, when the end time of the erase operation is reached, the application of the erase voltage $V_{erase}$ ends, the erase operation is completed, and the end time of the erase operation is the fifth time T5. When the erase voltage $V_{erase}$ is applied from the third time T1, in the current process of applying the erase voltage $V_{erase}$, it is assumed that the erase suspend command is received, in response to the erase suspend command, the erase sub-operation on the memory block is suspended at a certain time, for example, the erase voltage $V_{erase}$ currently applied is ended at a certain time, the time of ending the erase voltage $V_{erase}$ is the fifth time T5, where the fifth time T5 is the time before the end of the erase sub-operation, the third time length between the fifth time T5 and the third time T2 is less than the remaining time length of the erase operation, the remaining time length of the erase operation is subtracted from the third time length to obtain a new remaining time length, and when the erase resume command is received, the erase sub-operation is executed on the memory block according to the new remaining time length, so as to implement the remaining erase operation.

Figure 10:
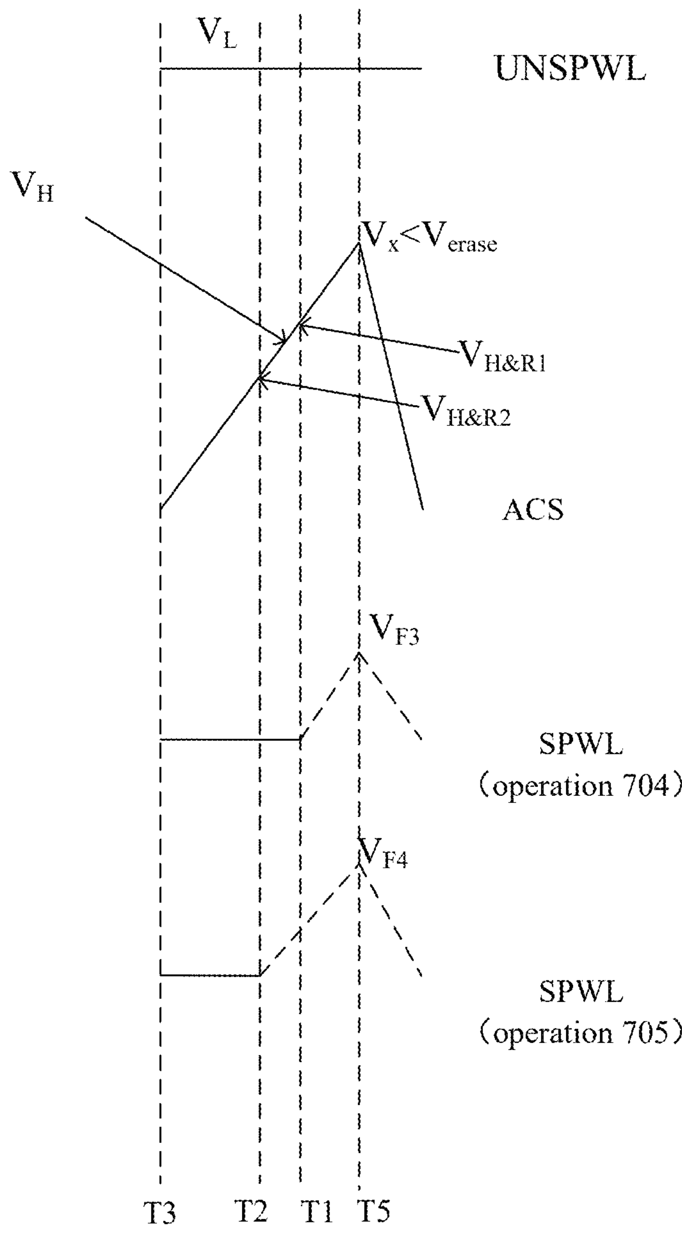
FIG. 10 is a voltage waveform diagram of another erasing process, according to an implementation of the present disclosure.

FIG. 9 shows that, before the fifth time T5, the voltage of the ACS (and/or BL) has maintained at the erase voltage $V_{erase}$, in some other implementations, as shown in FIG. 10, after the erase voltage $V_{erase}$ is applied to the ACS (and/or BL) to which the memory block is connected at the third time T3, it is assumed that when the voltage of the ACS rises to the fifth voltage $V_x$ ($V_x<V_{erase}$), the erase suspend command is received, and in response to the erase suspend command, the application of the erase voltage $V_{erase}$ ends at the fifth time T5, and the voltage of the ACS (and/or BL) is less than or equal to the erase voltage $V_{erase}$ during the current process of resume erase sub-operation. When $V_{H\&R1}<V_x<V_{erase}$, in response to the quantity of the erase suspends of the memory block being less than the threshold, the voltage of the SPWL to which the memory block is connected is released at the first time T1, the voltage of the SPWL rises to the sixth voltage $V_{F3}$ at the fifth time T5, where $0<V_{F3}<V_{F1}$; in response to the quantity of the erase suspends of the memory block being greater than or equal to the threshold, the voltage of the SPWL to which the memory block is connected is released at the second time T2, and the voltage of the SPWL rises to the seventh voltage $V_{F4}$ at the fifth time T5, where $0<V_{F4}<V_{F2}$.

In some other implementations, before executing operation 704 or operation 705, the control logic unit 412 queries the erase count flag of the memory block from the third register, and in response to the erase count flag of the memory block being the first flag (it indicates that the quantity of the erase suspends of the memory block is less than the threshold), the operation of releasing the voltage of the special word line to which the memory block is connected at the first time (as described above in operation 704) is executed, and in response to the erase count flag of the memory block being the second flag (it indicates that the quantity of the erase suspends of the memory block is greater than or equal to the threshold), the operation of releasing the voltage of the special word line to which the memory block is connected at the second time (as described in operation 705) is executed.

For example, as shown in FIG. 8, after the current erase operation (such as the pre-program operation, the erase sub-operation or the erase verification operation) is suspended in response to the erase suspend command in the erase operation process, the memory controller 102 sends an erase resume command to the memory 103, the control logic unit 412 in the memory 103 receives the erase resume command, determines whether the current erase operation is in the erase pulse phase in response to the erase resume command, and if the current erase operation is in the erase pulse phase, determines whether the erase count Flag_offset of the memory block is equal to 1. If the erase count flag Flag_offset is equal to 1 (it indicates that the erase count flag is the second flag and the quantity of erase suspends of the memory block reaches the threshold), then the first hold released voltage $V_{H\&R1}$ is increased by a negative voltage $V_{c\_spw1\_rls\_offset}$, to obtain a new hold released voltage $V_{H\&R}$ (i.e., the second hold released voltage $V_{H\&R2}$), and the remaining erase operation continues based on the new hold released voltage $V_{H\&R}$, for example, in the process of resuming the erase sub-operation, when the voltage of the ACS reaches the new hold released voltage $V_{H\&R}$, the voltage of the SPWL is released immediately. If the erase count flag Flag_offset is not equal to 1, for example, Flag_offset is equal to 0 (it indicates that the erase count flag Flag_offset is the first flag and the quantity of erase suspends of the memory block does not reach the threshold), then the original first hold released voltage $V_{H\&R1}$ is the hold released voltage $V_{H\&R}$, and the remaining erase operation continues based on the hold released voltage $V_{H\&R}$, for example, in the process of resuming the erase sub-operation, when the voltage of the ACS reaches the hold released voltage $V_{H\&R}$, the voltage of the SPWL is released immediately.

During the process of continuing the remaining erase operation, it is determined whether the memory block enters the erase suspend mode, for example, if the erase suspend command for the memory block is received again, the memory block enters the erase suspend mode, as shown in FIG. 8, in the erase suspend mode, executing the response to the erase suspend command, continuing counting the quantity of the erase suspends of the memory block, updating the erase count flag, and the like. If the erase suspend command for the memory block is not received again, the memory block does not enter the erase suspend mode and continues to execute the remaining erase operation.

Figure 7:
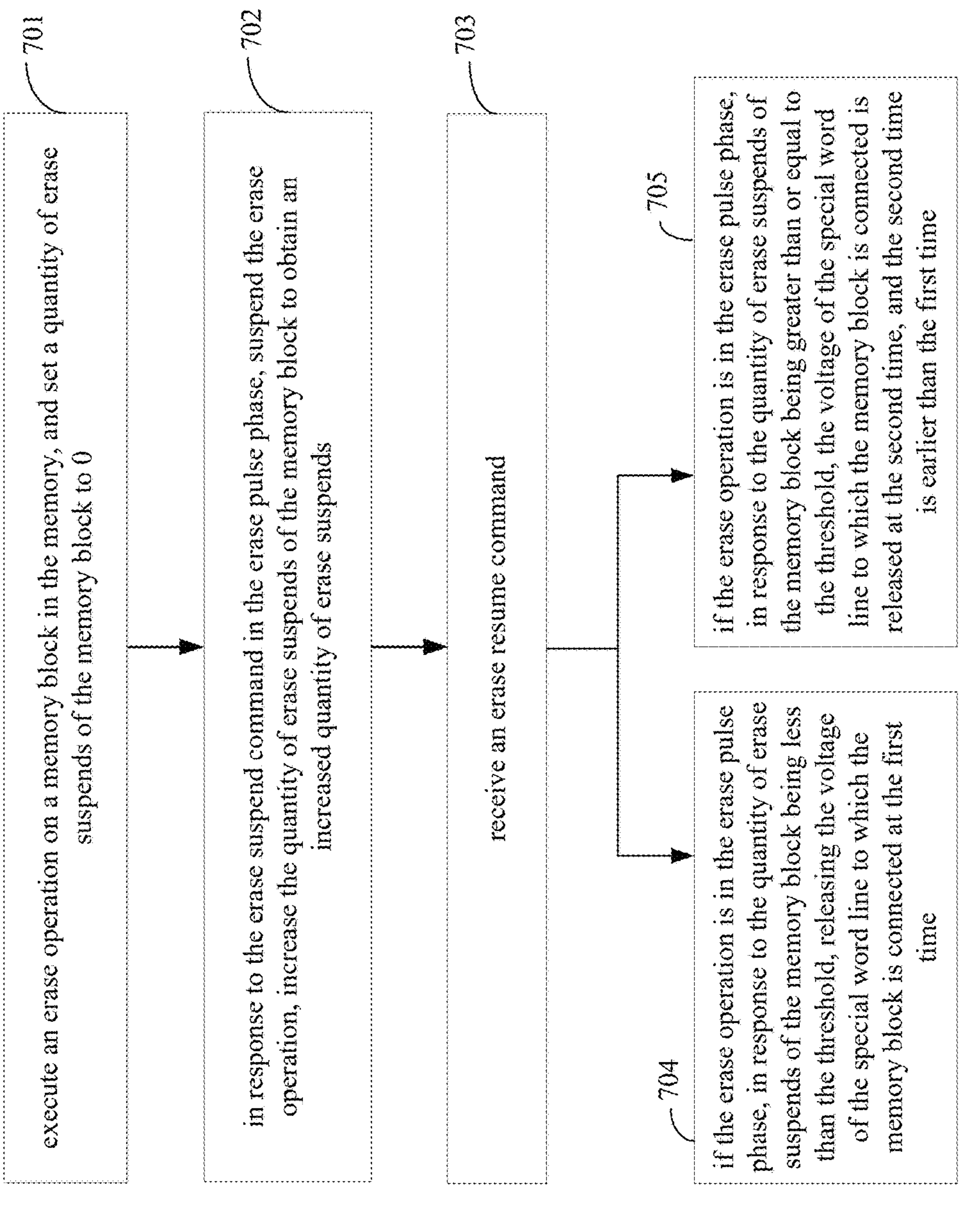
FIG. 7 is a flowchart illustrating a method for operating a memory, according to an implementation of the present disclosure.

In the erase operation method provided in the implementation of FIG. 7, by releasing the voltage of the special word line to which the memory block is connected in advance during the process of resuming the erase operation on the memory block, if the erase operation is in the erase pulse phase, in response to the quantity that the erase operation is suspended during the erase pulse phase is greater than or equal to the threshold, so that the voltage of the special word line can enter the floating state in advance, and the voltage of the special word line can be increased in advance along with the increase of the ACS (and/or BL) voltage, the voltage difference between the special word line and the ACS (and/or BL) in the current process of resuming the erase operation is decreased, and the voltage difference is prevented from exceeding the threshold voltage of the special unit, so that the special unit can be prevented from being weakly erased in the current process of resuming the erase operation, the quantity of weak erasing of the special unit in the erase operation process is decreased, and the reliability and performance of the memory can be improved.

The above description is only optional implementations of the present disclosure, and is not intended to limit the present disclosure, and any modification, equivalent substitution, improvement and the like made within the spirit and principle of the present disclosure shall be included within the protection scope of the present disclosure.

What is claimed is:

1. A method for operating a memory, comprising:

receiving an erase resume command, wherein the erase resume command indicates a resume of an erase operation on a memory block in a memory;

if the erase operation is in an erase pulse phase, releasing, at a first time, a voltage of a special word line to which the memory block is connected in response to a quantity of erase suspends of the memory block being less than a threshold, wherein the quantity of erase suspends refers to a quantity that the erase operation is suspended in the erase pulse phase; and releasing, at a second time, the voltage of the special word line in response to the quantity of erase suspends being greater than or equal to the threshold, wherein the second time is earlier than the first time.

2. The method of claim 1, wherein the threshold is greater than or equal to 20 and less than or equal to 60.

3. The method of claim 1, wherein the special word line is configured to connect a select gate or a virtual memory cell in the memory block.

4. The method of claim 1, wherein when the voltage of the special word line is released at the first time, the voltage of the special word line is maintained at a first voltage for a first time period after the first time; and when the voltage of the special word line is released at the second time, the voltage of the special word line is maintained at a second voltage for the first time period, wherein the second voltage is greater than the first voltage.

5. The method of claim 1, wherein after receiving the erase resume command, the method further includes:

if the erase operation is in the erase pulse phase, applying an erase voltage to at least one of an array common source or bit line to which the memory block is connected;

the releasing, at the first time, the voltage of the special word line to which the memory block is connected in response to the quantity of erase suspends of the memory block being less than the threshold includes:

in response to the quantity of erase suspends being less than the threshold, releasing the voltage of the special word line when the voltage of the at least one of the array common source or bit line rises to a third voltage, wherein the third voltage is less than the erase voltage; and the releasing, at the second time, the voltage of the special word line in response to the quantity of erase suspends being greater than or equal to the threshold includes:

in response to the quantity of erase suspends being greater than or equal to the threshold, releasing the voltage of the special word line when the voltage of the at least one of the array common source or bit line rises to a fourth voltage, wherein the fourth voltage is less than the third voltage.

6. The method of claim 1, wherein before receiving the erase resume command, the method further includes:

executing an erase operation on the memory block, and setting the quantity of erase suspends to 0; and in response to the erase suspend command in the erase pulse phase, suspending the erase operation, and increasing the quantity of erase suspends of the memory block, to obtain an increased quantity of erase suspends, wherein the erase suspend command indicates suspending the erase operation.

7. The method of claim 6, wherein when the quantity of erase suspends is less than the threshold, the erase count flag of the memory block is a first flag, wherein the first flag indicates that the quantity of erase suspends of the memory block does not reach the threshold; and when the quantity of erase suspends is greater than or equal to the threshold, the erase count flag of the memory block is a second flag, wherein the second flag indicates that the quantity of erase suspends of the memory block reaches the threshold.

8. The method of claim 7, wherein the releasing, at the first time, the voltage of the special word line to which the memory block is connected in response to the quantity of erase suspends of the memory block being less than the threshold includes:

releasing, at the first time, the voltage of the special word line to which the memory block is connected in response to the erase count flag of the memory block being the first flag; and the releasing, at the second time, the voltage of the special word line in response to the quantity of erase suspends being greater than or equal to the threshold includes:

releasing, at the second time, the voltage of the special word line in response to the erase count flag of the memory block being the second flag.

9. A memory, comprising:

a peripheral circuit; and a memory block comprising a special cell and a plurality of memory cells, wherein the peripheral circuit is coupled to the special cell through a special word line, the peripheral circuit is coupled to the plurality of memory cells through a plurality of non-special word lines, and the peripheral circuit is configured to:

receive an erase resume command, wherein the erase resume command indicates a resume of an erase operation on the memory block;

if the erase operation is in an erase pulse phase, release, at a first time, a voltage of the special word line to which the memory block is connected in response to a quantity of erase suspends of the memory block being less than a threshold, wherein the quantity of erase suspends refers to a quantity that the erase operation is suspended in the erase pulse phase; and release, at a second time, the voltage of the special word line in response to the quantity of erase suspends being greater than or equal to the threshold, wherein the second time is earlier than the first time.

10. The memory of claim 9, wherein the threshold is greater than or equal to 20 and less than or equal to 60.

11. The memory of claim 9, wherein the special cell includes a select gate or a virtual memory cell.

12. The memory of claim 9, wherein when the voltage of the special word line is released at the first time, the voltage of the special word line is maintained at a first voltage for a first time period after the first time; and when the voltage of the special word line is released at the second time, the voltage of the special word line is maintained at a second voltage for the first time period, wherein the second voltage is greater than the first voltage.

13. The memory of claim 9, wherein the peripheral circuit is further configured to:

if the erase operation is in the erase pulse phase, apply an erase voltage to at least one of an array common source or bit line to which the memory block is connected;

in response to the quantity of erase suspends being less than the threshold, release the voltage of the special word line when the voltage of the at least one of the array common source or bit line rises to a third voltage, wherein the third voltage is less than the erase voltage; and in response to the quantity of erase suspends being greater than or equal to the threshold, release the voltage of the special word line when the voltage of the at least one of the array common source or bit line rises to a fourth voltage, wherein the fourth voltage is less than the third voltage.

14. The memory of claim 9, wherein the peripheral circuit is further configured to:

execute an erase operation on the memory block, and set the quantity of erase suspends to 0; and in response to the erase suspend command in the erase pulse phase, suspend the erase operation, and increase the quantity of erase suspends of the memory block, to obtain an increased quantity of erase suspends, wherein the erase suspend command indicates suspending the erase operation.

15. The memory of claim 14, wherein when the quantity of erase suspends is less than the threshold, the erase count flag of the memory block is a first flag, and the first flag indicates that the quantity of erase suspends of the memory block does not reach the threshold; and when the quantity of erase suspends is greater than or equal to the threshold, the erase count flag of the memory block is a second flag, and the second flag indicates that the quantity of erase suspends of the memory block reaches the threshold.

16. The memory of claim 15, wherein the peripheral circuit is further configured to:

release, at the first time, the voltage of the special word line to which the memory block is connected in response to the erase count flag corresponding to the memory block being the first flag; and release, at the second time, the voltage of the special word line in response to the erase count flag corresponding to the memory block being the second flag.

17. The memory of claim 15, wherein the peripheral circuit includes a register configured to store at least one of the quantity of erase suspends, the threshold, and the erase count flag.

18. A memory system, comprising:

a memory comprising a memory block and a peripheral circuit;

a memory controller coupled to the memory and is configured to control the memory, wherein the memory block includes a special cell and a plurality of memory cells, the peripheral circuit is coupled to the special cell through a special word line, the peripheral circuit is coupled to the plurality of memory cells through a plurality of non-specific word lines, and the peripheral circuit is configured to:

receive an erase resume command, wherein the erase resume command indicates a resume of an erase operation on the memory block;

if the erase operation is in an erase pulse phase, release, at a first time, a voltage of the special word line to which the memory block is connected in response to a quantity of erase suspends of the memory block being less than a threshold, wherein the quantity of erase suspends refers to a quantity that the erase operation is suspended in the erase pulse phase; and release, at a second time, the voltage of the special word line in response to the quantity of erase suspends being greater than or equal to the threshold, wherein the second time is earlier than the first time.

19. The memory system of claim 18, wherein the threshold is greater than or equal to 20 and less than or equal to 60, and the special cell includes a select gate or a virtual memory cell.

20. The memory system of claim 18, wherein when the voltage of the special word line is released at the first time, the voltage of the special word line is maintained at a first voltage for a first time period after the first time; and when the voltage of the special word line is released at the second time, the voltage of the special word line is maintained at a second voltage for the first time period, wherein the second voltage is greater than the first voltage.

* * * * *